US012648091B2

(12) United States Patent
Hagiwara et al.

(10) Patent No.: US 12,648,091 B2
(45) Date of Patent: Jun. 2, 2026

(54) ELECTRONIC CONTROL DEVICE

(71) Applicant: Hitachi Astemo, Ltd., Hitachinaka (JP)

(72) Inventors: Katsumasa Hagiwara, Hitachinaka (JP); Masato Saito, Hitachinaka (JP); Michihito Watarai, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 168 days.

(21) Appl. No.: 18/558,481

(22) PCT Filed: Feb. 10, 2022

(86) PCT No.: PCT/JP2022/005492
§ 371 (c)(1),
(2) Date: Nov. 1, 2023

(87) PCT Pub. No.: WO2023/002650
PCT Pub. Date: Jan. 26, 2023

(65) Prior Publication Data
US 2024/0224441 A1 Jul. 4, 2024

(30) Foreign Application Priority Data

Jul. 20, 2021 (JP) ................................. 2021-119728

(51) Int. Cl.
H05K 5/02 (2006.01)
(52) U.S. Cl.
CPC ......... H05K 5/0214 (2022.08); H05K 5/0217 (2013.01); H05K 5/0247 (2013.01)
(58) Field of Classification Search
CPC . H05K 5/0214; H05K 5/00217; H05K 5/0247
(Continued)

(56) References Cited

U.S. PATENT DOCUMENTS

2013/0120943 A1 5/2013 Tamura et al.
2014/0080329 A1* 3/2014 Yamanaka ............... H05K 7/14
439/76.1
(Continued)

FOREIGN PATENT DOCUMENTS

EP 3 188 578 A1 7/2017
JP 2006-156217 A 6/2006
(Continued)

OTHER PUBLICATIONS

International Preliminary Report on Patentability (PCT/IB/338 & PCT/IB/373) issued in PCT Application No. PCT/JP2022/005492 dated Feb. 1, 2024, including Written Opinion (PCT/ISA/237) (7 pages).
(Continued)

*Primary Examiner* — Hung S. Bui
(74) *Attorney, Agent, or Firm* — Crowell & Moring LLP

(57) ABSTRACT

An electronic control device includes: a base member (4) that holds a board (2); a cover (5) that covers the board (2); a connector (3) that electrically connects the board (2) and the outside; a waterproof adhesive applied between any two of the base member (4), the cover (5), and the connector (3); and a liquid bypass (8) provided above a recess (60) that is a portion where the amount of protrusion of the waterproof adhesive to the outside is relatively small or above a waterproof adhesive located above a protrusion (44) of the waterproof adhesive protruding from the base member (4).

8 Claims, 17 Drawing Sheets

(58) Field of Classification Search
USPC .......................................................... 361/752
See application file for complete search history.

(56) References Cited

U.S. PATENT DOCUMENTS

| | | | |
|---|---|---|---|
| 2015/0250072 A1* | 9/2015 | Ichikawa ........... | H01R 13/5213 |
| | | | 439/587 |
| 2019/0252953 A1 | 8/2019 | Tsuboi et al. | |
| 2019/0307008 A1 | 10/2019 | Uchida et al. | |

FOREIGN PATENT DOCUMENTS

| | | | | | |
|---|---|---|---|---|---|
| JP | 2010-71348 A | 4/2010 | | | |
| JP | 2013-105766 A | 5/2013 | | | |
| JP | 2014-63868 A | 4/2014 | | | |
| JP | 2015153938 A | * | 8/2015 | .............. | H05K 5/00 |
| JP | 2017-117893 A | 6/2017 | | | |
| JP | 2017-220470 A | 12/2017 | | | |
| JP | 2018-74677 A | 5/2018 | | | |
| JP | 2018-95125 A | 6/2018 | | | |
| WO | WO 2016/031511 A1 | 3/2016 | | | |

OTHER PUBLICATIONS

International Search Report (PCT/ISA/210) issued in PCT Application No. PCT/JP2022/005492 dated Apr. 26, 2022 with English translation (6 pages).
Japanese-language Written Opinion (PCT/ISA/237) issued in PCT Application No. PCT/JP2022/005492 dated Apr. 26, 2022 with English translation (9 pages).

* cited by examiner

ELECTRONIC CONTROL DEVICE

TECHNICAL FIELD

The present invention relates to an electronic control device.

BACKGROUND ART

Conventionally, there has been known an electronic control device in which a circuit board on which electronic components are mounted is housed in a housing constituted by a base and a cover, and sealing is performed by interposing a sealing member between the base and the cover.

In particular, in an electronic control device that may be exposed to moisture, such as an electronic control device disposed in an engine room, a groove provided in a base is filled with a waterproof adhesive, a fixing protrusion provided on a lower surface of a cover is inserted into the groove to cause the waterproof adhesive to protrude, and entrance of moisture between the base and the cover is suppressed.

In particular, the electronic control device of PTL 1 accurately positions the base and the cover, thereby accurately positioning the waterproof adhesive and the fixing protrusion, reducing the variation in the amount and position of the protruding waterproof adhesive, and improving the reliability of the waterproof performance.

CITATION LIST

Patent Literature

PTL 1: JP 2014-63868 A

SUMMARY OF INVENTION

Technical Problem

In the above-described electronic control device, the waterproof adhesive is caused to protrude from between the base and the cover to eliminate the gap between the base and the cover, and moisture is suppressed from entering the gap.

However, due to the structure of the electronic control device and the problem of productivity, there is a portion where the waterproof adhesive cannot protrude from between the base and the cover. For example, the groove in the corner of the base is formed in an obtuse or curved shape in order to uniformly fill the waterproof adhesive. That is, at the corner of the base, the groove is provided inside the other portion. Further, a fastening portion that fastens the cover and the base by a screw or thermal caulking is set at a corner in order to secure a region of the circuit board, and is provided outside the groove (waterproof adhesive) in order to satisfy a waterproof function. That is, since the distance from the groove to the outer peripheral wall of the base is larger at corners than at other portions, the waterproof adhesive does not protrude from between the base and the cover, and a gap is easily formed between the base and the cover.

In an electronic control device in which a cover is installed on a base, water droplets attached to the cover run along the surface of the cover and fall onto the base due to gravity, wind pressure, vibration, or the like. If there is a gap between the base and the cover as described above, there is a case where the dropped water droplets flows and accumulate in the gap. In particular, when the water contains salt, the salt may accumulate in this gap, and the accumulated salt may corrode the seal boundary surface, leading to a loss of waterproof performance.

An object of the present invention is to provide an electronic control device capable of reducing the amount of salt accumulated.

Solution to Problem

In order to achieve the above object, the present invention includes: a base member that holds a board; a cover that covers the board; a connector that electrically connects the board and the outside; a waterproof adhesive applied between any two of the base member, the cover, and the connector; and a liquid bypass provided above a recess that is a portion where an amount of protrusion of the waterproof adhesive to the outside is relatively small or above a waterproof adhesive located above a protrusion of the waterproof adhesive protruding from the base member.

Advantageous Effects of Invention

According to the present invention, since the accumulation amount of salt can be reduced by the bypass of liquid, deterioration of the waterproof performance of the electronic control device can be reduced. Objects, configurations, and effects other than those described above will be clarified by the following description of embodiments.

DESCRIPTION OF EMBODIMENTS

Figure 1:
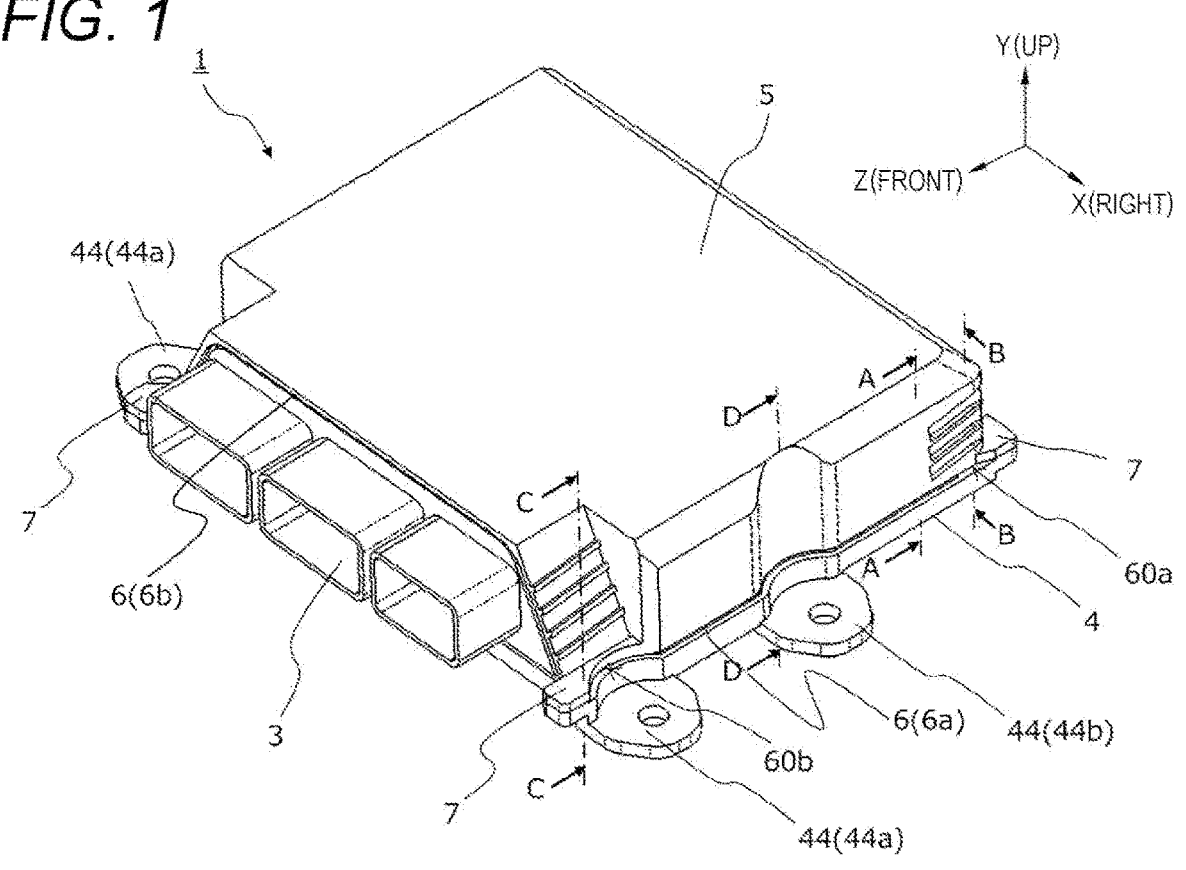
FIG. 1 is a plan-side perspective view of an electronic control device according to a first embodiment of the present invention.

Hereinafter, the configuration and operation of the electronic control device according to the first to fifth embodiments of the present invention will be described with reference to the drawings. In the drawings, the same reference numerals denote the same parts. In each of the plan view and the cross-sectional view, directions are specified by XYZ axes orthogonal to each other, and +X is defined as "right", −X is defined as "left", +Y is defined as "upper", −Y is defined as "lower", +Z is defined as "front", and −Z is defined as "rear".

First Embodiment

Figure 2:
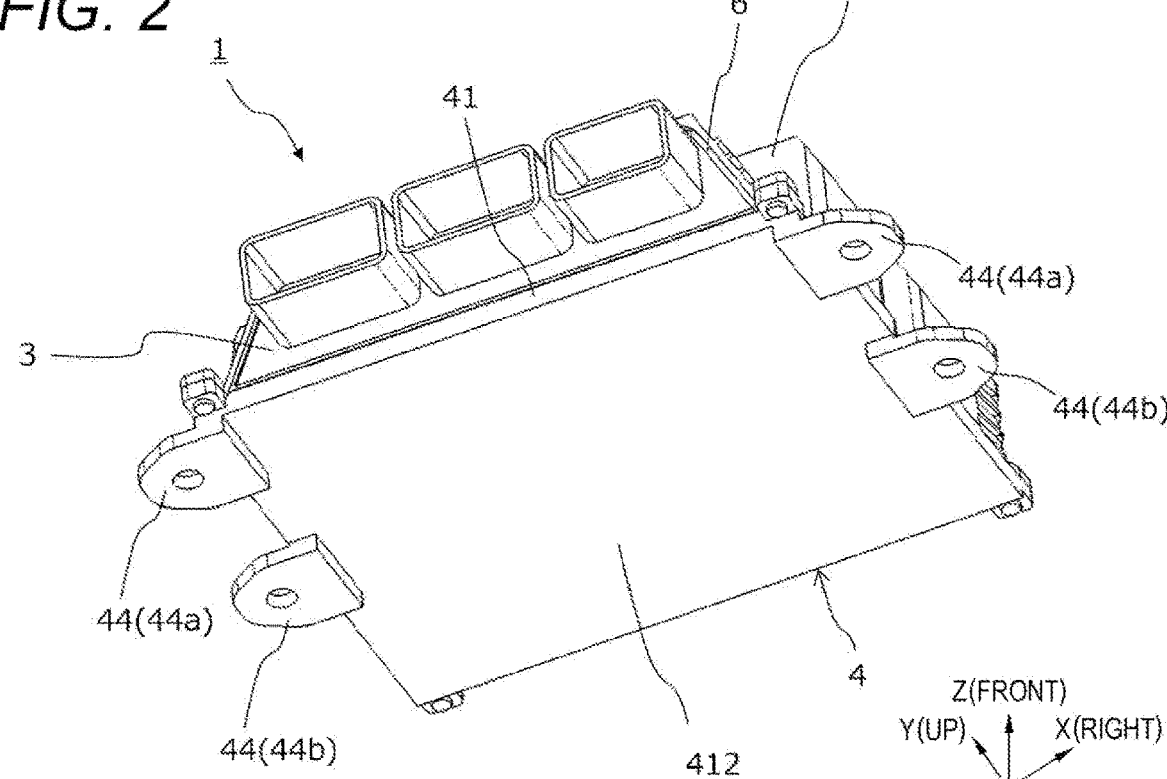
FIG. 2 is a bottom-side perspective view of the electronic control device according to the first embodiment of the present invention.
Figure 3:
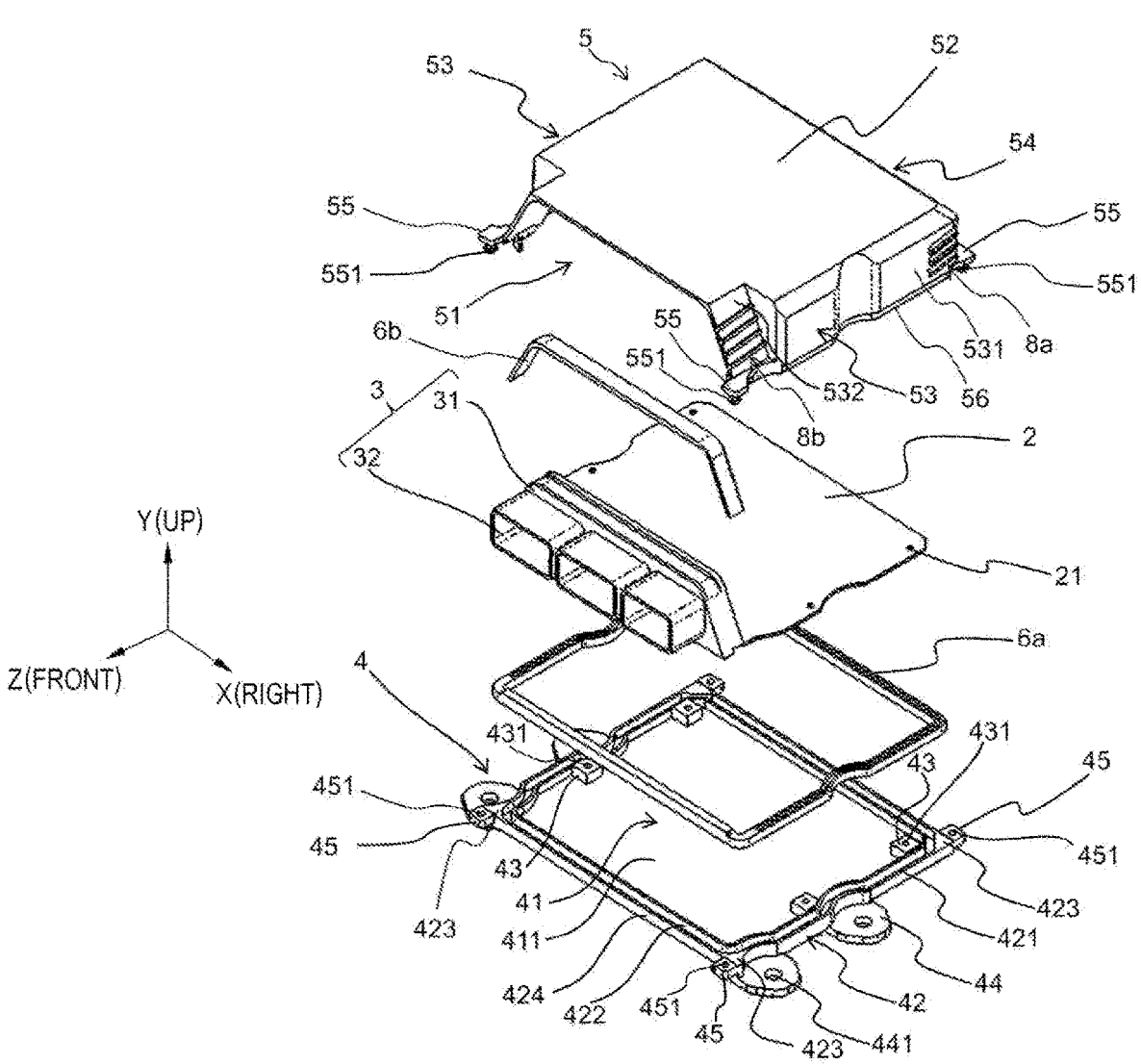
FIG. 3 is an exploded perspective view of the electronic control device according to the first embodiment of the present invention.

FIG. 1 is a plan-side perspective view of the electronic control device 1 according to the present embodiment, FIG. 2 is a bottom-side perspective view of the electronic control device 1 according to the present embodiment, and FIG. 3 is an exploded perspective view of the electronic control device 1 according to the present embodiment.

The electronic control device 1 is an engine control unit (ECU) mounted in an engine room, and includes a circuit board 2 (see FIG. 3), a connector 3, a base 4, a cover 5, a sealing material 6, and a fastening portion 7.

The circuit board 2 is a so-called printed wiring board on which electronic components (not shown) are mounted. The circuit board 2 is provided with a plurality of (four in the present embodiment) fixing holes 21, and the connector 3 is attached to the front end portion (+Z-direction end portion).

The connector 3 is a component into which an external connector is inserted to electrically connect the circuit board 2 to a battery or the like, and can be made of a resin such as polybutylene terephthalate (PBT), polyamide, or polyphenylene sulfide (PPS). The connector 3 is provided with an attachment base portion 31, a connection port 32, and a plurality of connector terminals (not shown), and the attachment base portion 31 can be fixed to the circuit board 2 via the plurality of connector terminals by soldering.

The base 4 is a component that holds the circuit board 2 to which the connector 3 is attached, and can be made of metal containing aluminum, iron, or the like as a main component. The base 4 is provided with a plate portion 41 (see FIGS. 2 and 3), an annular peripheral wall 42 (see FIG. 3), a plurality of (four in the present embodiment) board fixing portions 43 (see FIG. 3), and a plurality of (four in the present embodiment) flanges 44. The base 4 can also be made of a resin such as PBT, PPS, or nylon.

The plate portion 41 (see FIG. 3) is, for example, a rectangular plate-like portion. The peripheral wall 42 is formed around the plate portion 41, the plurality of board fixing portions 43 are formed on the upper surface 411, and the plurality of flanges 44 are formed on the lower surface 412 (see FIG. 2).

The peripheral wall 42 is an annular member protruding above the plate portion 41 (+Y direction). A groove 422 is formed on the upper surface 421 of the peripheral wall 42, and a plurality of base fastening portions 45 protrude from side surfaces of corners 423 (corners 423 are also corners of the plate portion 41 and the base 4) of the peripheral wall 42.

The groove 422 is a groove provided on the upper surface 421 of the peripheral wall 42 and having a substantially U-shaped cross-section, and a waterproof adhesive filled in the groove is solidified to form a sealing material 6a. Note that the sealing material 6a illustrated in FIG. 3 schematically illustrates a shape after the waterproof adhesive is solidified.

The groove 422 is formed in an obtuse or curved shape around the corner 423 so that the waterproof adhesive is substantially uniformly filled over the entire circumference. Therefore, at the corner 423 of the base 4, the groove 422 is provided inside the outer periphery of the other portion. The base fastening portion 45 to be described later is provided on the peripheral wall 42 of the corner 423 of the base 4. Therefore, at the corner 423 of the peripheral wall 42, the distance between the groove 422 and the outer periphery of the peripheral wall 42 of the base 4 is larger than at the other portions, and the area of the corner 423 among the area of the upper surface 421 of the peripheral wall 42 is larger than the area of the other portions (see FIG. 4).

The plurality of (four in the present embodiment) base fastening portions 45 are, for example, quadrangular prism portions protruding forward and backward (in the Z-axis direction) from the outer peripheral surface 424 of the peripheral wall 42 located at the corner 423, and each base fastening portion 45 is provided with a boss hole 451 penetrating vertically (in the Y-axis direction).

The plurality of (four in the present embodiment) board fixing portions 43 are portions to which the circuit board 2 is fixed, and protrude upward from the upper surface 411 of the plate portion 41 to substantially the same height as the peripheral wall 42 in the vicinity of the inner side surface of the peripheral wall 42. A screw hole 431 is provided on the upper surface of each board fixing portion 43.

5

Figure 4:
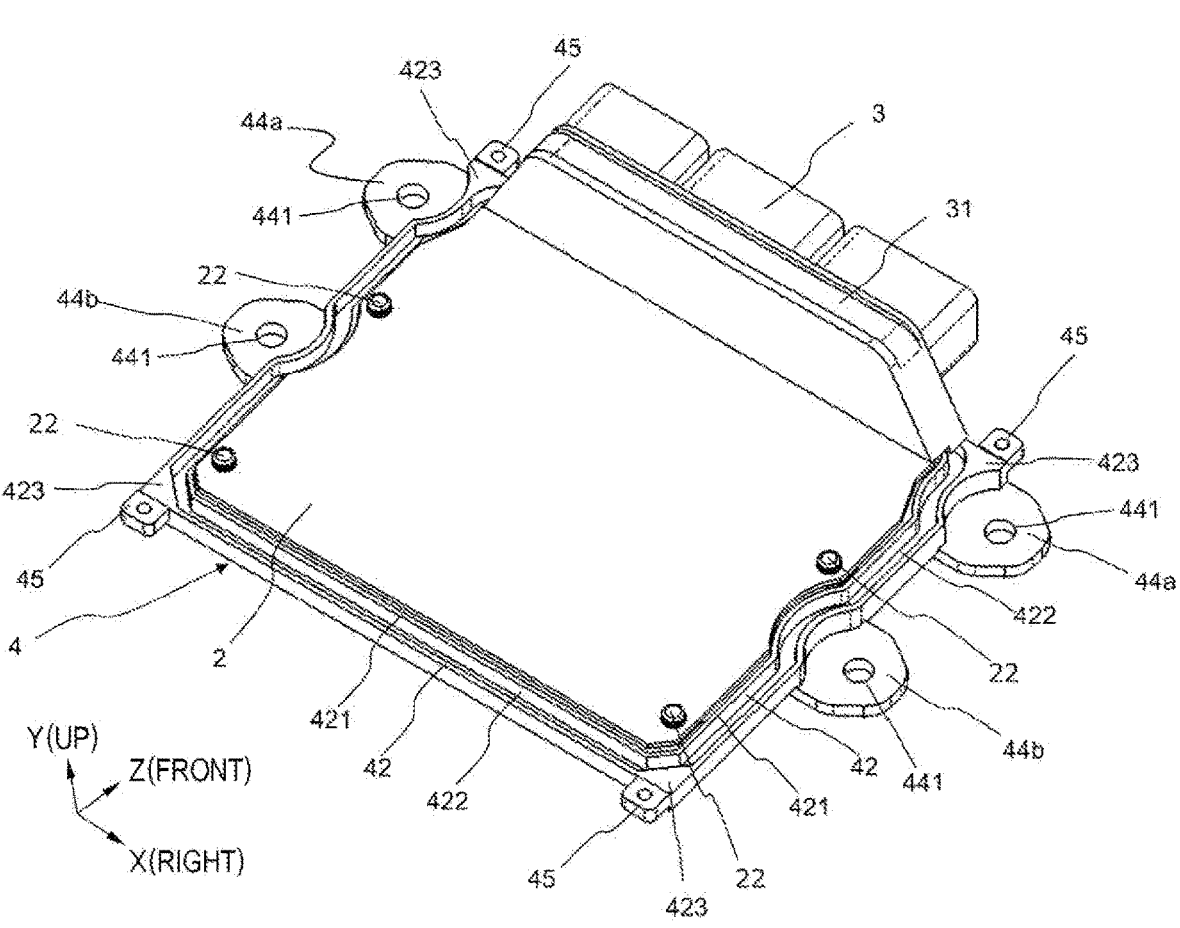
FIG. 4 is a perspective view illustrating a state in which a circuit board to which a connector is attached is fixed to a base in the electronic control device according to the first embodiment of the present invention.

FIG. 4 is a perspective view illustrating a state in which the circuit board 2 to which the connector 3 is attached is fixed to the base 4. The circuit board 2 to which the connector 3 is attached is placed on the four board fixing portions 43 (see FIG. 3), and screws 22 (see FIG. 4) are inserted into the fixing holes 21 (see FIG. 3) of the circuit board 2, and screwed into the screw holes 431 (see FIG. 3) of the board fixing portion 43, whereby the circuit board 2 is fixed to the base 4. A lower portion of the attachment base portion 31 of the connector 3 is bonded by a waterproof adhesive filled in the groove 422, and a space between the attachment base portion 31 and the base 4 is sealed.

The plurality of (four in the present embodiment) flanges 44 are plate-like portions for fixing the base 4 to the vehicle with bolts or the like, and are coupled to the lower surface 412 of the plate portion 41 and protrude in the X-axis direction (left-right direction). A bolt hole 441 is provided substantially at the center of each of the flanges 44. The four flanges 44 of the present embodiment include two first flanges 44a on the front side and two second flanges 44b on the rear side.

The peripheral wall 42 above the flange 44 is curved in an arc shape to secure a distance from the center of the bolt hole 441, and the moment of inertia of area is increased as compared with the linear peripheral wall 42. As a result, not only the deformation of the sealing material 6a above the flange 44 is suppressed, but also the generated stress is reduced, and the strength is improved.

Returning to FIGS. 1 to 3, the cover 5 is a component that is fastened to the base 4 by the fastening portion 7 (see, for example, FIG. 1) and covers the circuit board 2 and the attachment base portion 31 of the connector 3, and can be made of a resin such as PBT, PPS, or nylon. The cover 5 can also be made of a metal containing aluminum, iron, or the like as a main component.

The cover 5 includes an opening portion 51 (see FIG. 3) formed on the front surface, a plate-shaped top plate portion 52 covering the upper side, side plate portions 53 closing the left and right, a rear plate portion 54 closing the back surface, and a plurality of (four in the present embodiment) cover fastening portions 55. Protrusions 56, which are projecting portions to be inserted into the grooves 422 of the base 4, are formed at lower ends of the left and right-side plate portions 53 and the rear plate portion 54, respectively.

The opening portion 51 is a portion that exposes the connection port 32 of the connector 3 to the outside and covers the attachment base portion 31 of the connector 3. A waterproof adhesive is applied to the upper surface of the attachment base portion 31 of the connector 3, and the waterproof adhesive is solidified to form a sealing material 6b after the cover 5 and the base 4 are bonded to each other. Note that the sealing material 6b illustrated in FIG. 3 schematically illustrates a shape after the waterproof adhesive is solidified.

The four cover fastening portions 55 are portions provided for fastening the cover 5 to the base 4, and are provided at four corners of the lower end of the cover 5. A boss 551 is provided on a lower surface of the cover fastening portion 55.

The boss 551 serves as a positioning pin when the cover 5 is attached to the base 4 and prevents the cover 5 attached to the base 4 from being detached from the base 4.

The sealing material 6 is a solidified waterproof adhesive. The waterproof adhesive may be any waterproof adhesive having fluidity at the time of filling, and is not particularly limited to a specific configuration. For example, the waterproof adhesive can be selected according to the specifications of the electronic control device, such as an epoxy type, a silicone type, and an acrylic type.

As described above, the sealing material 6 used in the electronic control device of the present embodiment includes the sealing material 6a that is filled in the groove 422 and seals between the attachment base portion 31 and the base 4 and between the base 4 and the cover 5 of the connector 3, and the sealing material 6b that seals between the attachment base portion 31 and the cover 5 of the connector 3.

The fastening portion 7 is a portion for fastening the base 4 and the cover 5, and includes the base fastening portion 45 and the cover fastening portion 55. As described above, the base fastening portion 45 is provided with the boss hole 451 penetrating in the vertical direction (Y-axis direction), and the lower surface of the cover fastening portion 55 is provided with the boss 551.

The fastening portion 7 fastens the base 4 and the cover 5 by inserting the boss 551 into the boss hole 451, melting and solidifying the tip protruding from the boss hole 451 by, for example, a predetermined heating jig, and performing thermal caulking.

Figure 5:
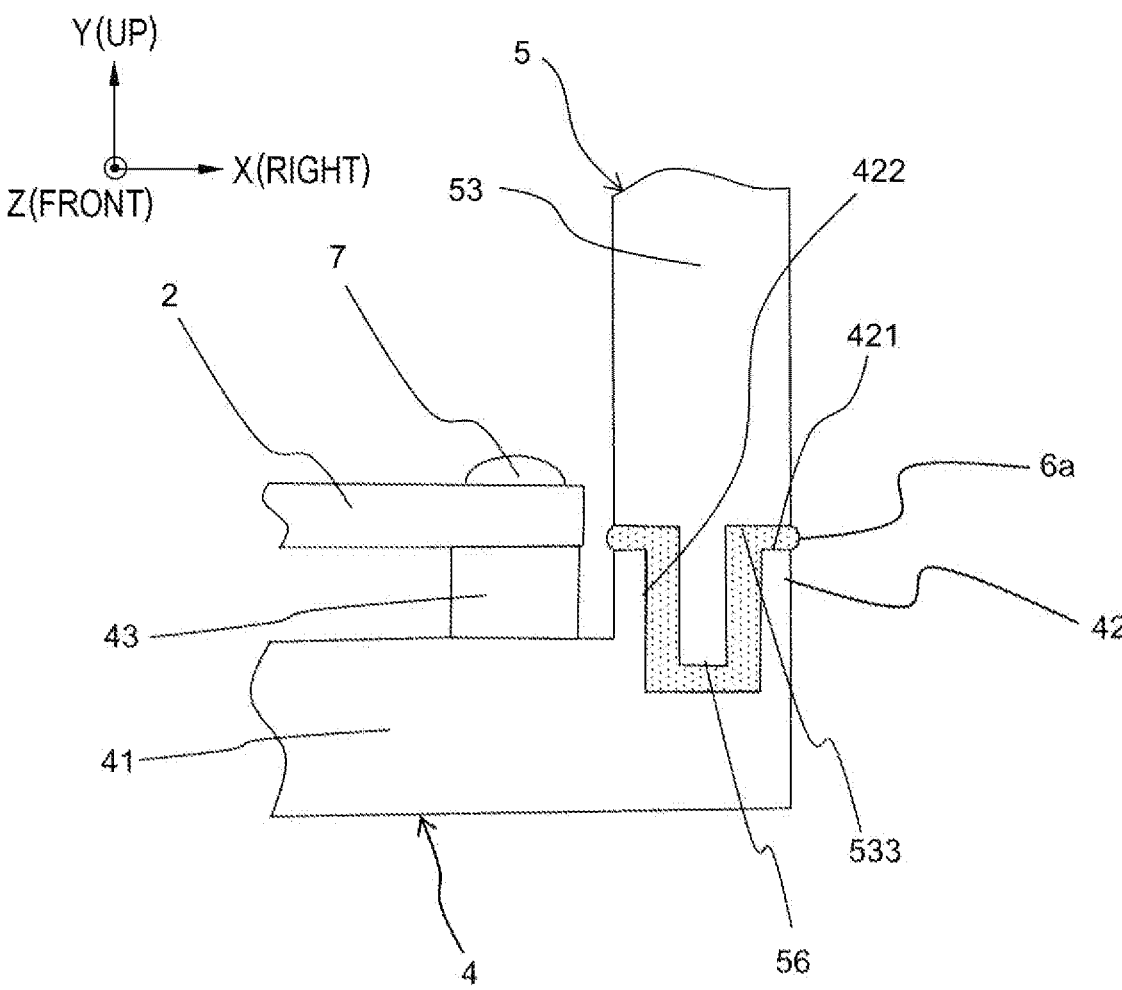
FIG. 5 is a cross-sectional view taken along arrows A-A of the electronic control device illustrated in FIG. 1.

FIG. 5 is a cross-sectional view taken along arrows A-A of the electronic control device 1 illustrated in FIG. 1. When the boss 551 (see FIG. 3) of the cover 5 is inserted into the boss hole 451 (see FIG. 3) of the base 4 in order to fasten the base 4 and the cover 5, the protrusion 56 of the cover 5 is inserted into the groove 422 of the base 4.

When the protrusion 56 is inserted into the groove 422, the waterproof adhesive filled in the groove 422 overflows from the groove 422, and overflows from between the lower surface 533 of the side plate portion 53 of the cover 5 and the upper surface 421 of the peripheral wall 42 of the base 4 to the outside of the cover 5 and the base 4.

Then, the waterproof adhesive is solidified to become the sealing material 6a, and as illustrated in FIG. 5, the lower surface 533 of the side plate portion 53 of the cover 5 and the upper surface 421 of the peripheral wall 42 of the base 4 are sealed without a gap. Note that a space between the lower surface (not illustrated) of the rear plate portion 54 and the upper surface 421 of the peripheral wall 42 of the base 4 is similarly sealed by the sealing material 6a.

Figure 6:
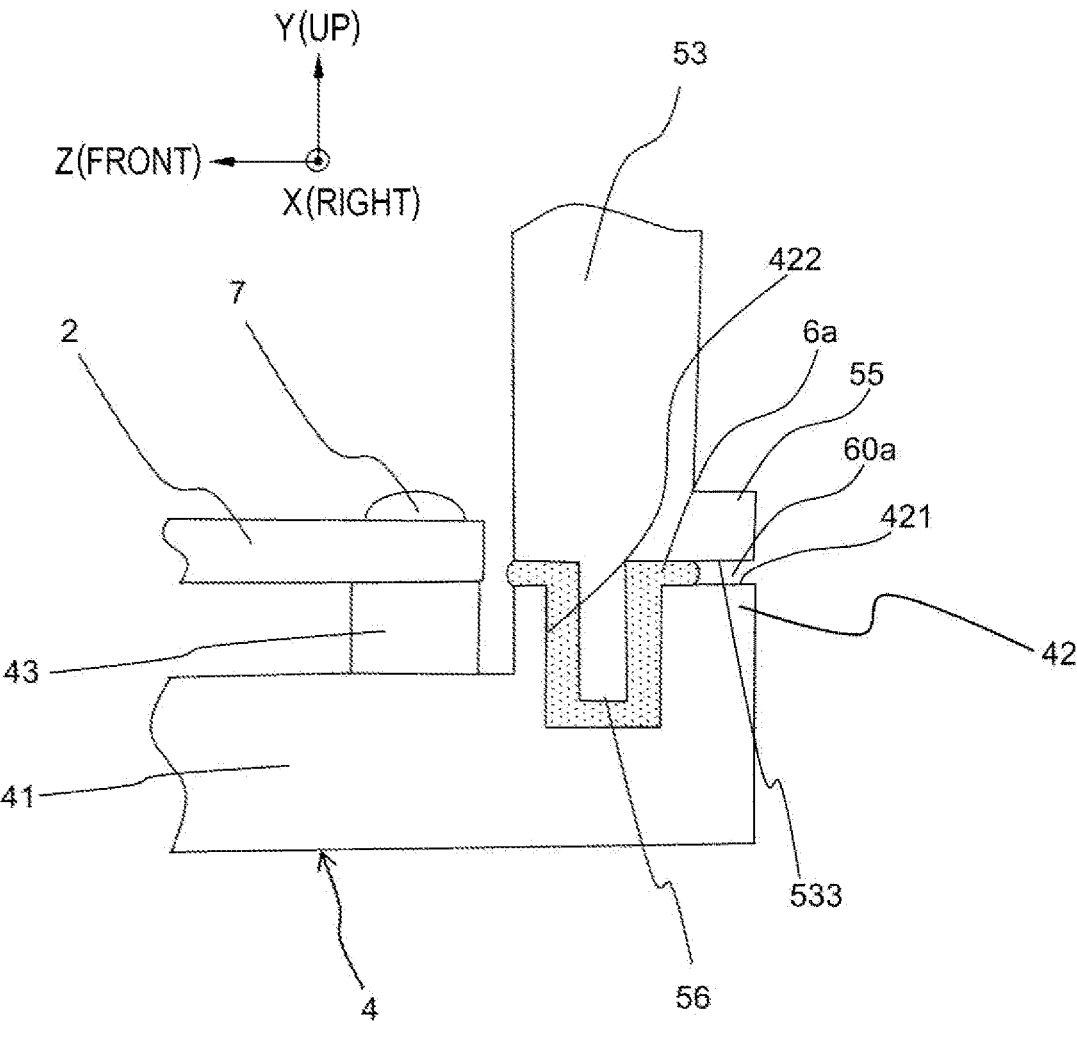
FIG. 6 is a cross-sectional view taken along arrows B-B of the electronic control device illustrated in FIG. 1.
Figure 7:
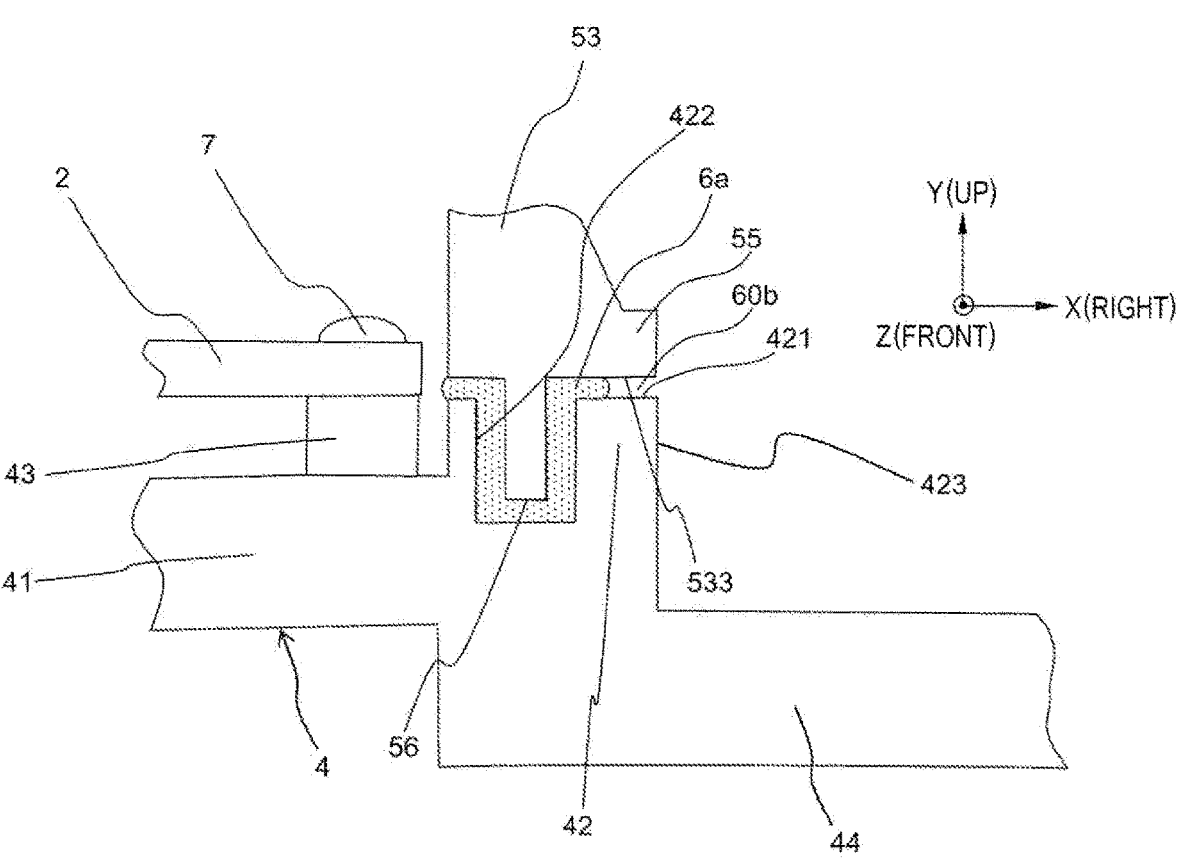
FIG. 7 is a cross-sectional view of the electronic control device illustrated in FIG. 1 taken along arrows C-C.

FIG. 6 is a cross-sectional view (see FIG. 1) of the electronic control device 1 taken along arrows B-B of the electronic control device 1 at the corner 423 located on the rear right side of the electronic control device 1, and FIG. 7 is a cross-sectional view (see FIG. 1) of the electronic control device 1 taken along arrows C-C of the electronic control device 1 shown at the corner 423 located on the front right side of the electronic control device 1.

Since the waterproof adhesive is substantially uniformly filled over the entire circumference of the groove 422, the amount of the waterproof adhesive overflowing from the groove 422 when the protrusion 56 is inserted into the groove 422 is also substantially uniform.

However, as described above, the groove 422 is formed in an obtuse or curved shape around the corner 423. Therefore, at the corner 423 of the peripheral wall 42, the distance between the groove 422 and the outer periphery of the peripheral wall 42 of the base 4 is larger than at the other portions, and the area of the corner 423 among the area of the upper surface 421 of the peripheral wall 42 is larger than the area of the other portions (see FIG. 4).

Therefore, in the corner 423, as illustrated in FIGS. 6 and 7, the amount of the waterproof adhesive protruding to the outside is relatively small between the lower surface 533 of the cover 5 and the upper surface 421 of the peripheral wall 42 of the base 4 as compared with other portions, and gaps (recesses) 60a and 60b are formed.

In the present embodiment, the bypass 8 (the first bypass 8a and the second bypass 8b) for changing the direction in which the liquid (droplet) flows down is provided at a place located above the gaps (recesses) 60a and 60b on the surface of the side plate portion 53 of the cover 5.

Figure 8:
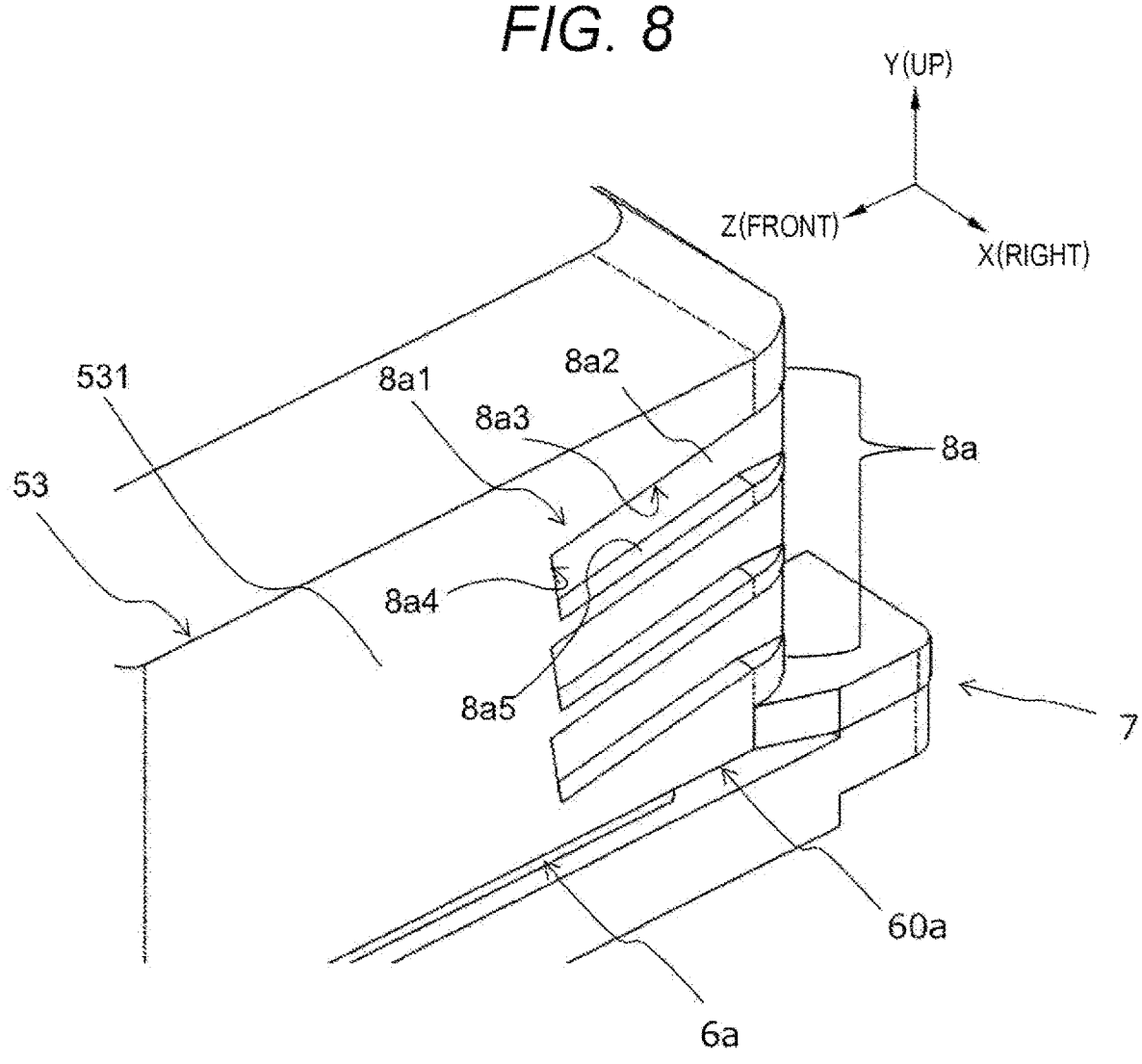
FIG. 8 is an enlarged perspective view of a first bypass provided on a side surface plate portion of a cover in the electronic control device according to the first embodiment of the present invention.

FIG. 8 is an enlarged perspective view of the first bypass 8a provided on the rear side surface (rear-side surface portion 531) of the right-side plate portion 53 of the cover 5 in the electronic control device 1 according to the present embodiment.

The first bypass 8a is provided above the gap 60a (see FIG. 1) and is a flow path for changing the direction of liquid droplets flowing along the surface of the rear-side surface portion 531 of the side plate portion 53.

The first bypass 8a has at least one groove 8a1 provided in the rear-side surface portion 531 of the side plate portion 53. The groove 8a1 is a linear groove recessed with respect to the rear-side surface portion 531 and having a rear end (end portion in the -Z direction) opened, and has a bottom surface 8a2, an upper inner wall 8a3, a front inner wall 8a4, and a lower inner wall 8a5.

The bottom surface 8a2 is, for example, substantially parallel to the rear-side surface portion 531, and the upper inner wall 8a3, the front inner wall 8a4, and the lower inner wall 8a5 intersect, for example, substantially perpendicular to the rear-side surface portion 531. The upper inner wall 8a3 and the lower inner wall 8a5 are lower on the front side and higher on the rear side, for example. Therefore, the liquid droplets flowing down along the surface of the rear-side surface portion 531 above the gap 60a flow to the front side in the upper inner wall 8a3 and the lower inner wall 8a5, and the sealing material 6a flows down to a portion protruding from between the side plate portion 53 of the cover 5 and the peripheral wall 42 of the base 4.

Figure 9:
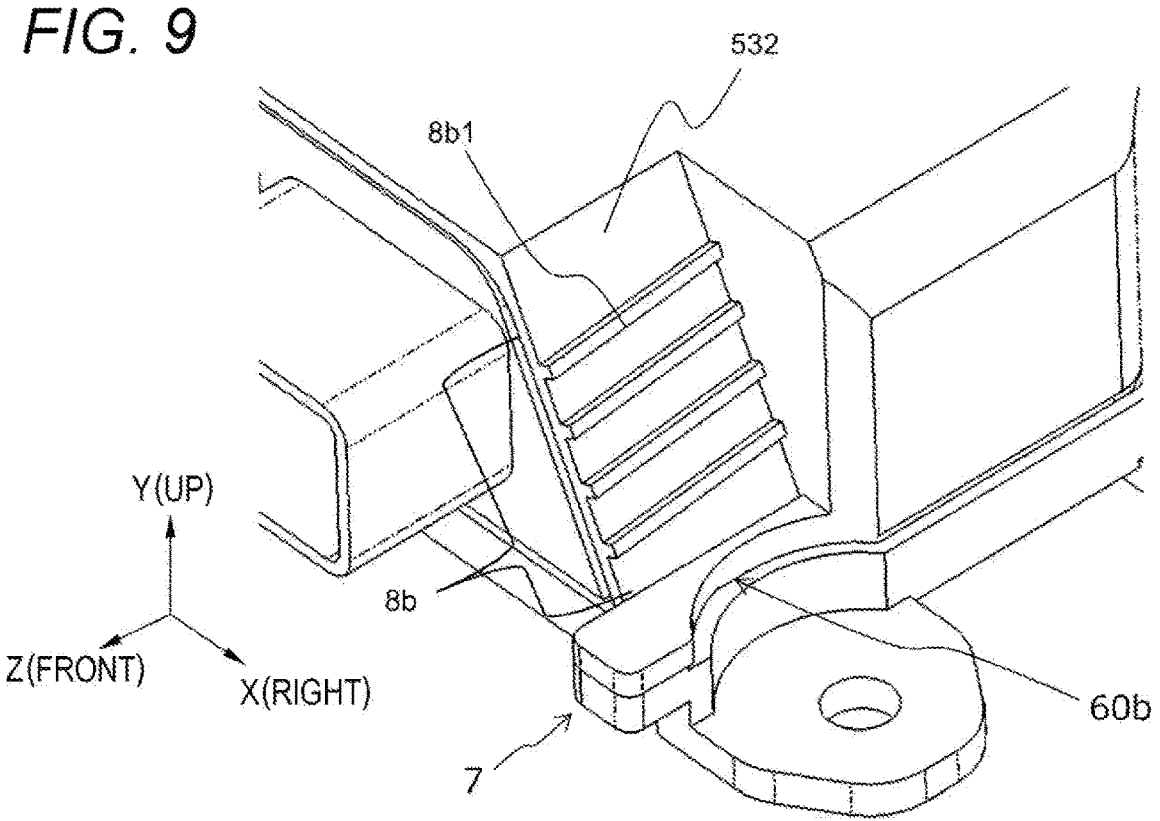
FIG. 9 is an enlarged perspective view of a second bypass provided on a side surface plate portion of the cover in the electronic control device according to the first embodiment of the present invention.

FIG. 9 is an enlarged perspective view of a second bypass 8b provided in the inclined surface portion 532 on the front side (+Z side) of the side plate portion 53 of the cover 5 in the electronic control device 1 according to the present embodiment.

The second bypass 8b is provided above the gap 60b, and is a flow path for changing the direction of liquid droplets flowing along the surface of the inclined surface portion 532 on the front side of the side plate portion 53.

The second bypass 8b has at least one protrusion 8a1 provided on the inclined surface portion 532 of the side plate portion 53. The protrusion 8b1 is, for example, a linear projection having a rectangular cross-sectional shape, protrudes substantially perpendicularly from the inclined surface portion 532, and is lower on the front side and higher on the rear side. Therefore, the liquid droplets flowing down along the surface of the inclined surface portion 532 of the side plate portion 53 flow to the front side in the protrusion 8b1 and are suppressed from flowing down to the gap 60b.

Operation and Effect

In the electronic control device 1 according to the present embodiment, as illustrated in FIGS. 6 and 7, the gap (recess) 60, which is a portion in which the amount of the waterproof adhesive protruding to the outside is relatively small, may be formed between the lower surface 533 of the cover 5 and the upper surface 421 of the corner 423 of the peripheral wall 42 of the base 4. However, above the gap (recess) 60, the bypass 8 that covers the entire gap (recess) 60 in the front-rear direction and allows water droplets to flow to a portion where the sealing material 6a protrudes is provided. Therefore, liquid droplets flowing down along the surface of the side plate portion 53 of the cover 5 are prevented from flowing into the gap 60. As a result, the amount of salt accumulated in the gap 60 can be reduced, so that deterioration of waterproof performance can be reduced.

Second Embodiment

Figure 10:
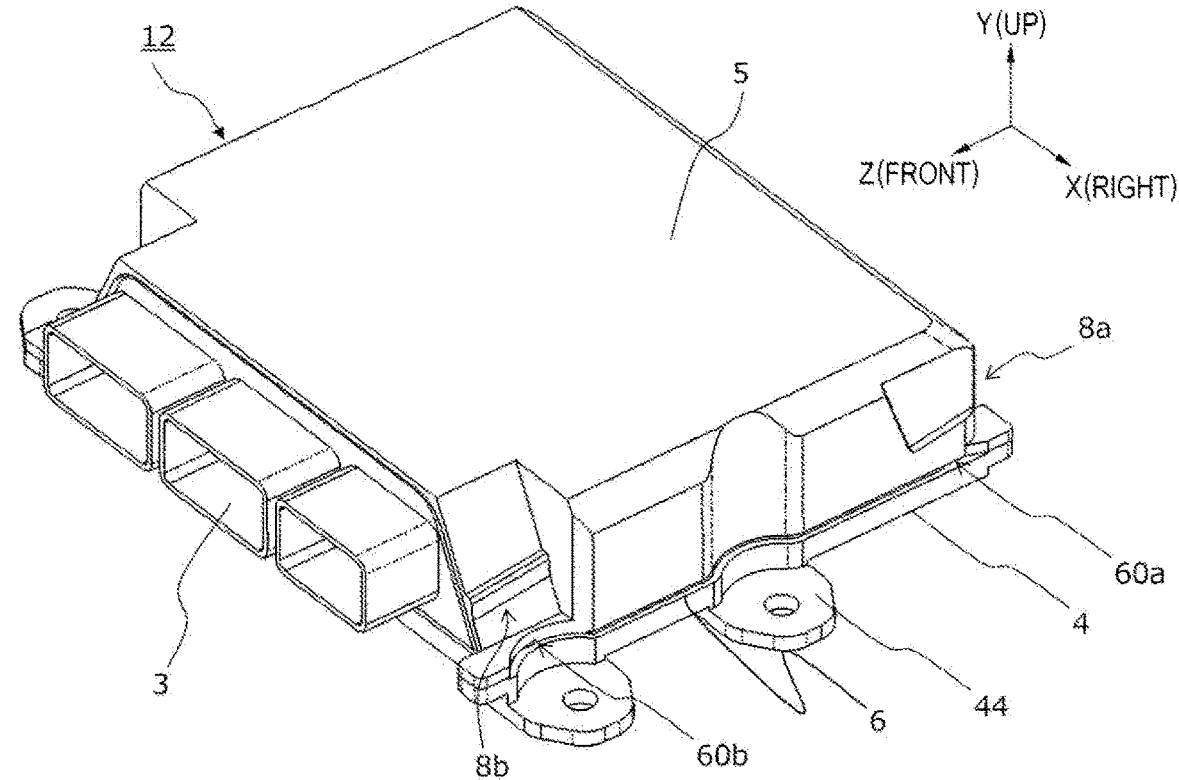
FIG. 10 is a perspective view of an electronic control device according to a second embodiment of the present invention.

FIG. 10 is a perspective view of an electronic control device 12 according to the second embodiment. The electronic control device 12 according to the present embodiment is different from the electronic control device 1 according to the first embodiment in the shapes of the first bypass 8a and the second bypass 8b.

Figure 11:
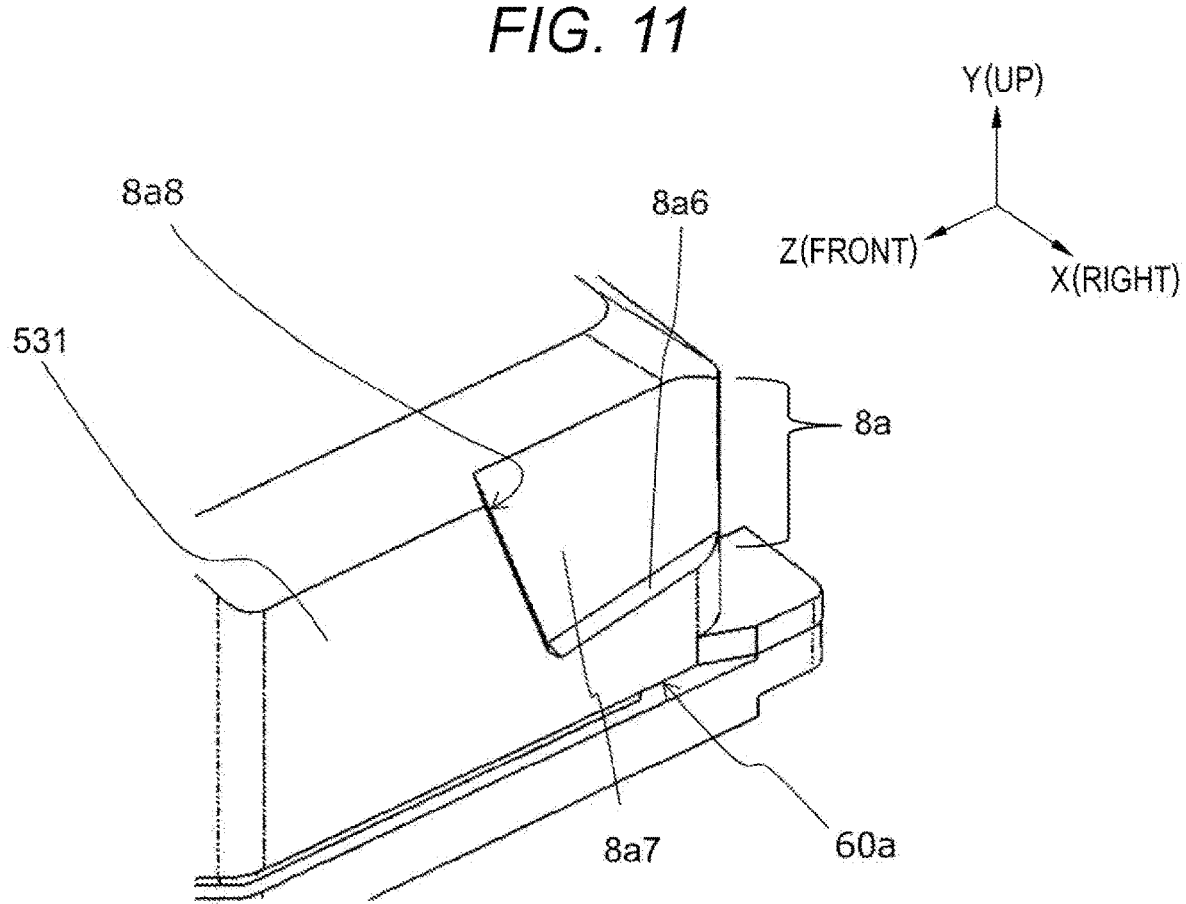
FIG. 11 is an enlarged perspective view of a first bypass provided on a side surface plate portion of a cover in the electronic control device according to the second embodiment of the present invention.

FIG. 11 is an enlarged perspective view of the first bypass 8a provided on the rear-side surface portion 531 on the rear side (-Z side) of the side plate portion 53 of the cover 5 in the electronic control device 12 according to the present embodiment.

In the first bypass 8a of the present embodiment, the first bypass 8a is open at the upper side (+Y direction), the rear side (-Z direction), and the right side (+X side), and has a stepped portion 8a6, a side surface 8a7, and a front surface 8a8.

The stepped portion 8a6 is a portion extending in the front-rear direction (lateral direction) and having an opening on the upper side, and is an inclined surface that intersects the rear-side surface portion 531 substantially perpendicularly, for example, and is lower on the front side and higher on the rear side. The side surface 8a7 is an inclined surface rising from the left end of the stepped portion 8a6 and having, for example, an upper end positioned on the left side of the lower end. The front surface 8a8 is an inclined surface rising from a front end portion of the stepped portion 8a6 and having, for example, an upper end positioned forward of the lower end.

Therefore, the liquid droplets flowing down along the surfaces of the side surface 8a7 and the front surface 8a8 above the gap 60a flow forward at the stepped portion 8a6 and flow down to the portion where the sealing material 6a protrudes.

Figure 12:
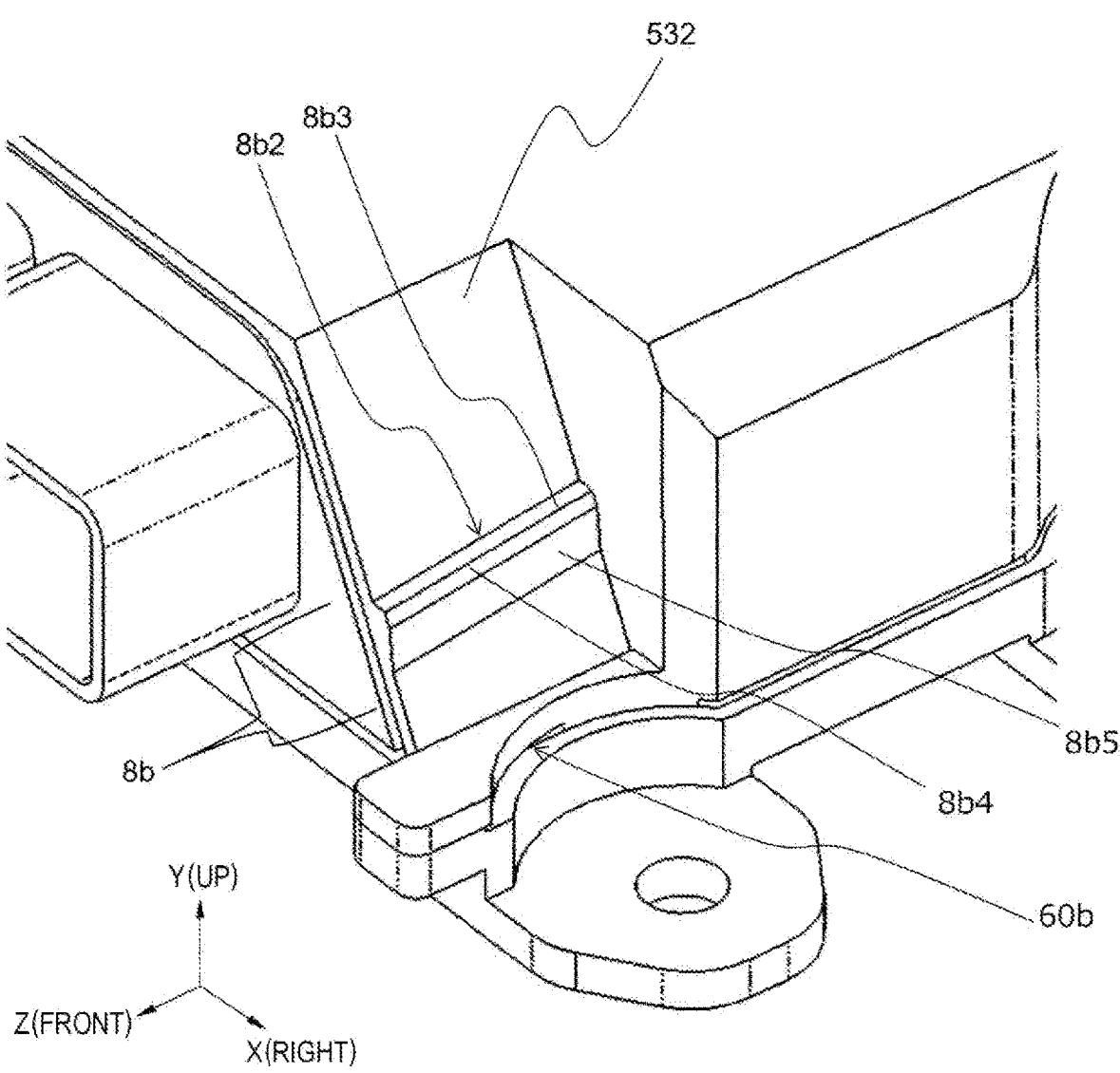
FIG. 12 is an enlarged perspective view of a second bypass provided on the side surface plate portion of the cover in the electronic control device according to the second embodiment of the present invention.

FIG. 12 is an enlarged perspective view of a second bypass 8b provided in the inclined surface portion 532 on the front side (+Z side) of the side plate portion 53 of the cover 5 in the electronic control device 12 according to the present embodiment.

The second bypass 8b of the present embodiment has a protrusion 8b2 which is one linear projection. The protrusion 8b2 is a protrusion protruding from the inclined surface portion 532 and having a trapezoidal cross-section extending in the front-rear direction (Z-axis direction), and has an upper surface 8b3, a side surface 8b4, and a lower surface 8b5.

The upper surface 8b3 is, for example, substantially parallel to the X axis, and is lower on the front side and higher on the rear side. Therefore, the liquid droplets flowing down along the surface of the inclined surface portion 532 above the gap 60b flow to the front side at the upper surface 8b3, and are suppressed from flowing down to the gap 60b.

The intersecting angle between the side surface 8b4 and the upper surface 8b3 is an obtuse angle. The lower surface 8b5 intersects the side surface 8b4 at an obtuse angle, and intersects the upper surface 8b3 at a right angle or more. Therefore, an intersection angle between any two surfaces of the upper surface 8b3, the side surface 8b4, and the lower surface 8b5 is a right angle or more.

Operation and Effect

Similarly to the electronic control device 1 according to the first embodiment, the electronic control device 12 according to the present embodiment can change the direction of the liquid droplets flowing down along the surface of the side plate portion 53 of the cover 5, suppress the liquid droplets from accumulating in the gap 60, and reduce the deterioration of the waterproof performance.

The first bypass 8a of the present embodiment has a stepped portion 8a6 extending in the front-rear direction (lateral direction) and having an open upper portion. In addition, the second bypass 8b of the present embodiment is one linear projection (protrusion 8b2), the protrusion 8b2 has a plurality of surfaces (the upper surface 8b3, the side surface 8b4, and the lower surface 8b5), and a minimum value of an intersecting angle between any two surfaces of the plurality of surfaces is a right angle or more. Therefore, the first bypass 8a and the second bypass 8b do not have an undercut portion, and have a shape that does not require a slide type. Therefore, it is possible to suppress complication of a mold for molding the cover 5, and to suppress an increase in cost of the mold.

Third Embodiment

Figure 13:
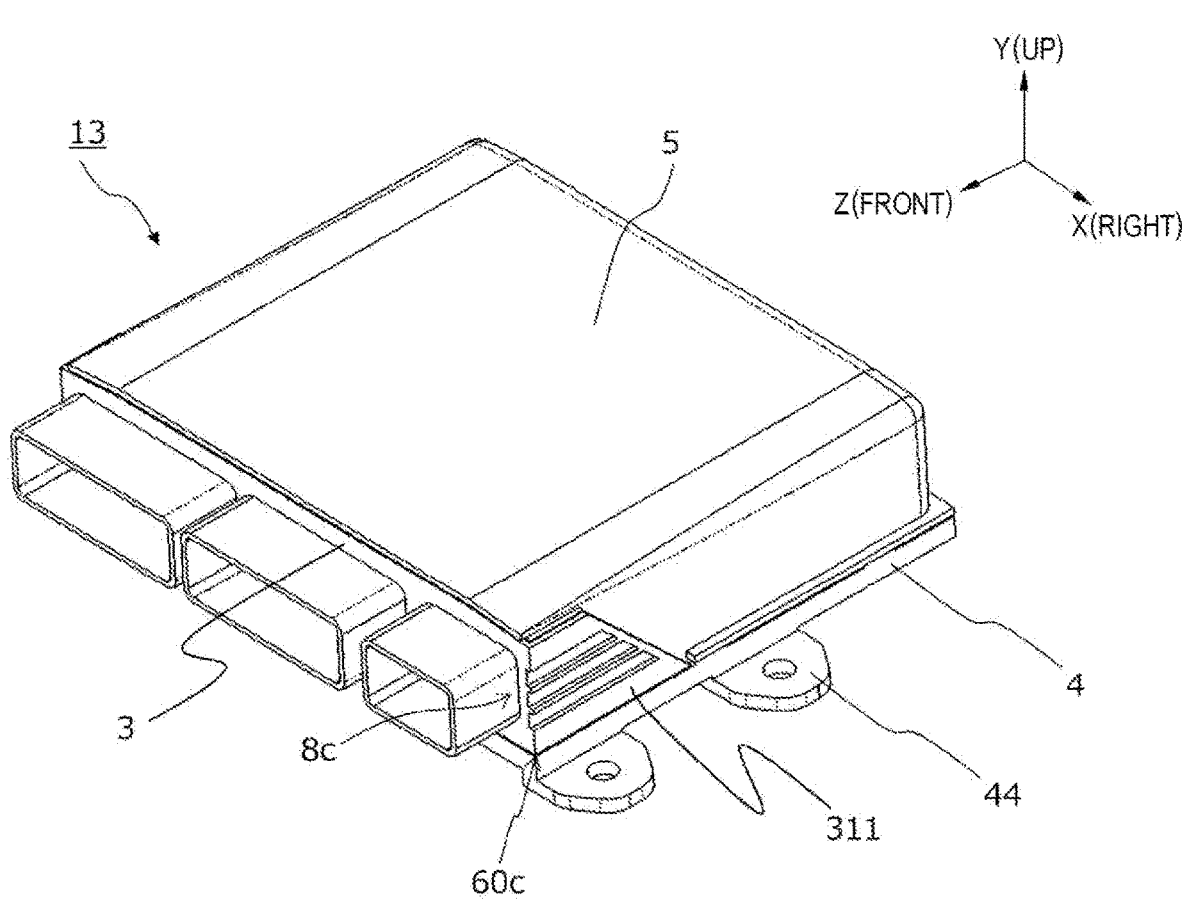
FIG. 13 is a perspective view of an electronic control device according to a third embodiment of the present invention.
Figure 14:
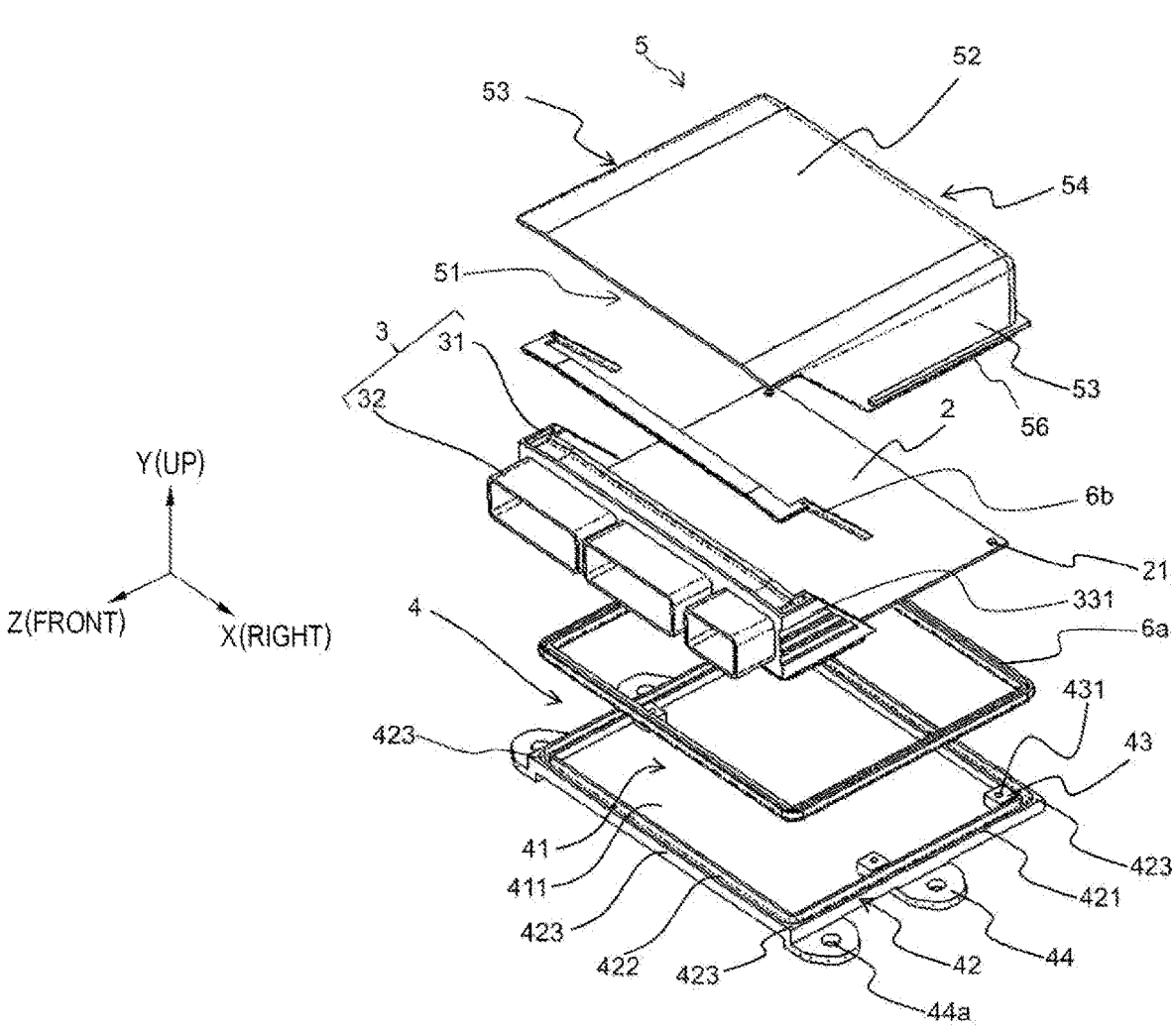
FIG. 14 is an exploded perspective view of the electronic control device according to the third embodiment of the present invention.

FIG. 13 is a perspective view of an electronic control device 13 according to a third embodiment, and FIG. 14 is an exploded perspective view of the electronic control device 13 according to the third embodiment. The electronic control device 13 according to the present embodiment is different from the electronic control device 1 according to the first embodiment in that a bypass 8c is provided in the connector 3.

In the connector 3 of the present embodiment, the left and right side surfaces 311 of the attachment base portion 31 are exposed to the outside, and the attachment base portion 31 is placed on the upper surface 421 of the front corner 423 of the peripheral wall 42 of the base 4. Therefore, a gap (recess) 60c, which is a portion where the amount of protrusion of the waterproof adhesive to the outside is relatively small, is formed between the corner 423 on the front side of the peripheral wall 42 of the base 4 and the attachment base portion 31 of the connector 3 above the corner.

In this case, liquid droplets attached to the surfaces of the left and right side surfaces 311 of the attachment base portion 31 of the connector 3 on the upper surface 421 may drop along the surface of the side surface 311 due to gravity, wind pressure, or vibration, and enter and accumulate in the gap 60c.

In the present embodiment, a bypass 8c is provided at a position above the gap (recess) 60c on the surface of the side surface 311 of the connector 3 to suppress the liquid droplets from flowing down.

Figure 15:
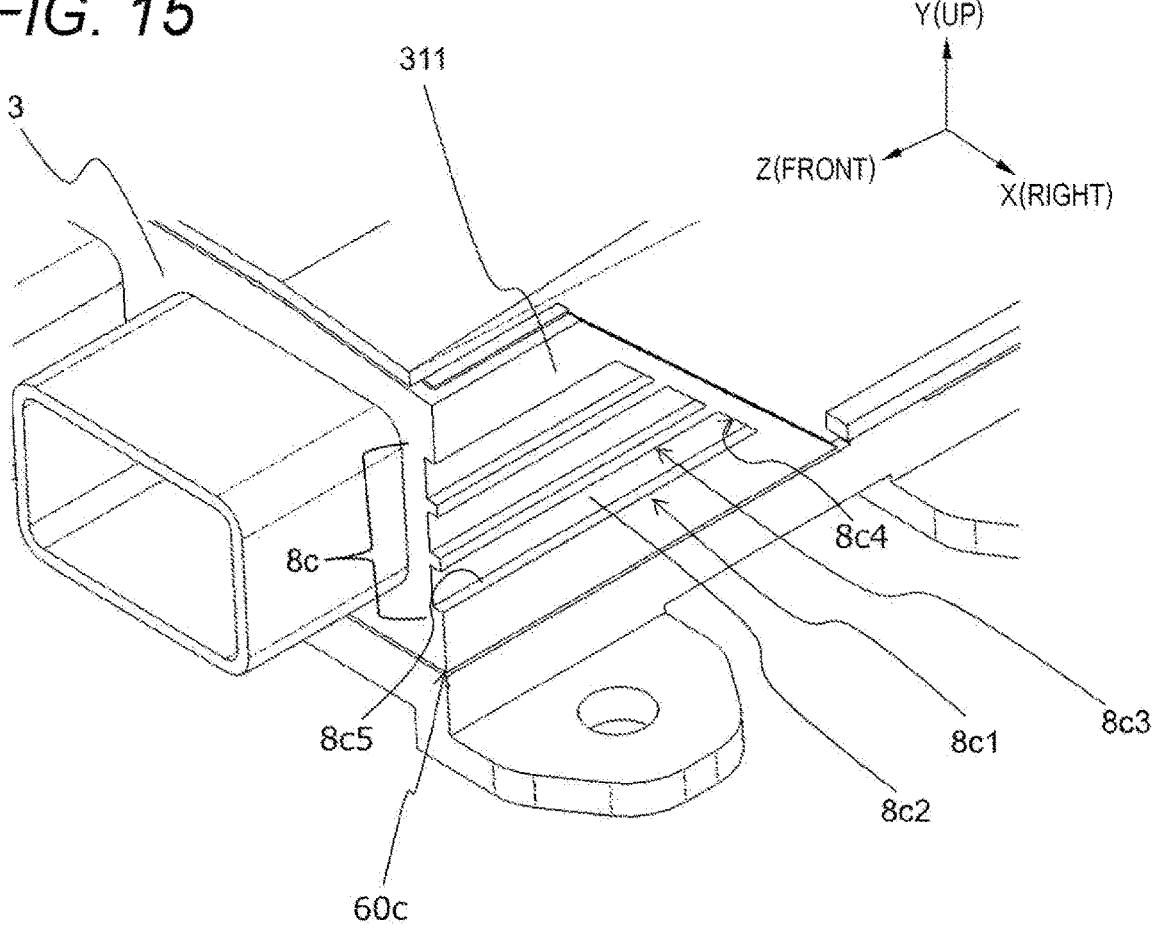
FIG. 15 is an enlarged perspective view of a bypass provided on a side surface of a connector in the electronic control device according to the third embodiment of the present invention.

FIG. 15 is an enlarged perspective view of a bypass 8c provided on the side surface 311 of the connector 3 in the electronic control device 13 according to the present embodiment.

The bypass 8c is provided above the gap 60c (see FIG. 13), and is a flow path for changing the direction of liquid droplets flowing along the surface of the side surface 311 of the connector 3.

The bypass 8c forms at least one groove 8c1 provided on the side surface 311 of the connector 3. The groove 8c1 is a linear groove recessed with respect to the side surface 311 and having a front end (+Z direction end portion) opened, and includes a bottom surface 8c2, an upper inner wall 8c3, a rear inner wall 8c4, and a lower inner wall 8c5.

The bottom surface 8c2 is, for example, substantially parallel to the side surface 311, and the upper inner wall 8c3, the rear inner wall 8c4, and the lower inner wall 8c5 intersect, for example, substantially perpendicular to the side surface Therefore, the liquid droplets flowing down along the 311. surface of the side surface 311 of the connector 3 are accumulated in the lower inner wall 8c5 and flow down from the opening at the front end.

Note that the groove 8c1 may have a lower front end side and a higher rear end side, and liquid droplets flowing down along the surface of the side surface 311 of the connector 3 may flow down to the front side along the upper inner wall 8c3 and the lower inner wall 8c5.

Operation and Effect

In the electronic control device 13 according to the present embodiment, there is a case where a gap (recess) 60c, which is a portion where the amount of protrusion of the waterproof adhesive to the outside is relatively small, is formed between the lower surface of the connector 3 and the upper surface 421 of the corner 423 of the peripheral wall 42 of the base 4. However, a bypass 8c that covers the entire gap (recess) 60c in the front-rear direction and prevents water droplets from flowing into the gap (recess) 60c is provided above the gap (recess) 60c. Therefore, droplets flowing down along the surface of the side surface 311 of the connector 3 are prevented from flowing into the gap 60c. As a result, the amount of salt accumulated in the gap 60c can be reduced, so that deterioration of waterproof performance can be reduced.

Fourth Embodiment

Figure 16:
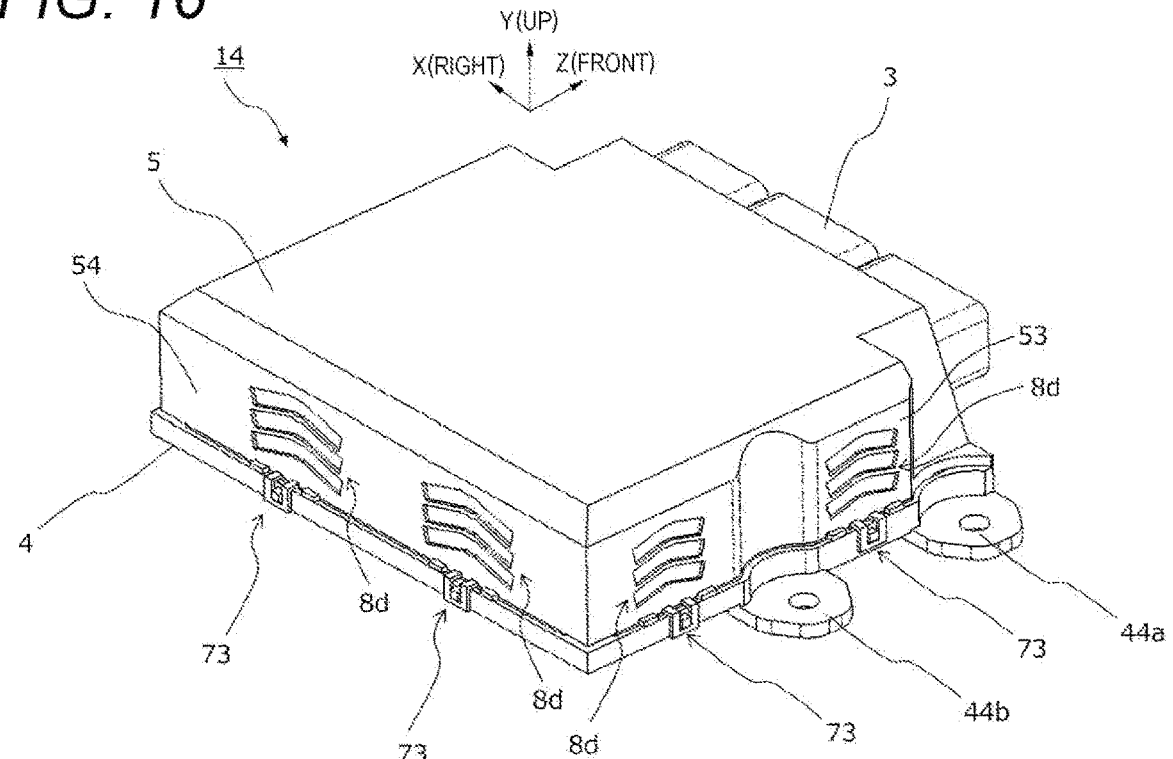
FIG. 16 is a perspective view of an electronic control device according to a fourth embodiment of the present invention.

FIG. 16 is a perspective view of an electronic control device 14 according to a fourth embodiment. The electronic control device 14 according to the present embodiment is different from the electronic control device 1 according to the first embodiment in a method of coupling the base 4 and the cover 5. That is, while the first embodiment realizes coupling using thermal caulking, the present embodiment realizes coupling using snap-fit.

Figure 17:
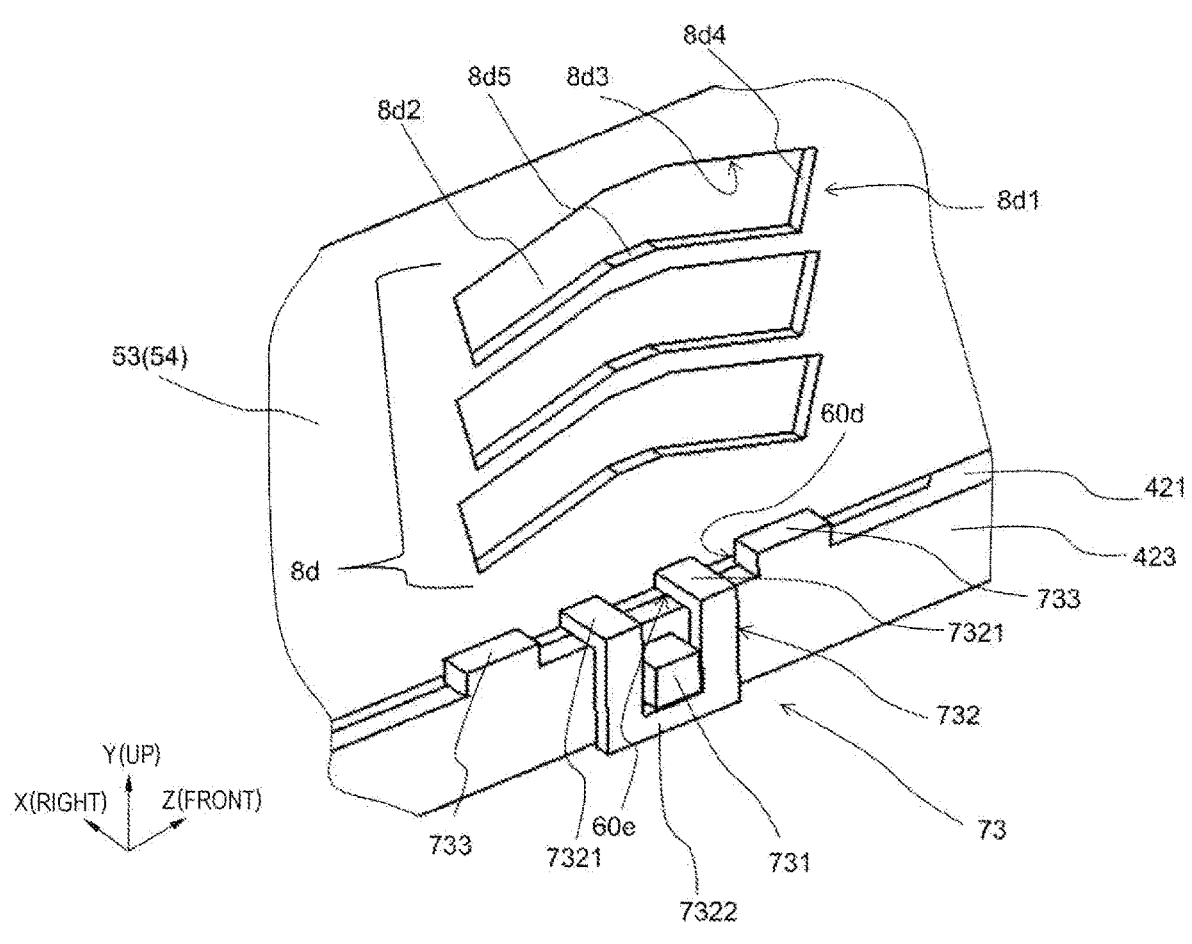
FIG. 17 is an enlarged perspective view of a snap-fit coupling portion and a bypass of an electronic control device according to a fourth embodiment of the present invention.

FIG. 17 is an enlarged perspective view of the snap-fit coupling portion 73 and the bypass 8d of the electronic control device 14 according to the present embodiment. The snap-fit coupling portion 73 has a hook 731, a latch 732 and two guides 733.

The hook 731 is, for example, a projection protruding from the outer peripheral surface 424 of the peripheral wall 42 of the base 4. The latch 732 is, for example, a substantially U-shaped leaf spring, and includes two protruding portions 7321 protruding from a lower end of the side plate portion 53 of the cover 5, and a U-shaped plate portion 7322 coupled to the two protruding portions 7321 and having a lower end hooked on the hook 731.

The two guides 733 are, for example, protrusions protruding from the upper surface 421 of the peripheral wall 42 of the base 4, and prevent the outer peripheral surface 424 of the peripheral wall 42 from bulging outward and the latch 732 from being detached from the hook 731.

When the latch 732 is hooked on the hook 731 to couple the cover 5 with the base 4, the protrusion 56 of the cover 5 is inserted into the groove 422 of the base 4.

When the protrusion 56 is inserted into the groove 422, the waterproof adhesive filled in the groove 422 overflows from the groove 422, and overflows from between the lower surface 533 of the side plate portion 53 of the cover 5 and the upper surface 421 of the peripheral wall 42 of the base 4 to the outside of the cover 5 and the base 4. However, two guides 733 are provided on the upper surface 421 of the peripheral wall 42 of the base 4, and the waterproof adhesive is suppressed from protruding by the two guides 733. Therefore, the amount of protrusion of the waterproof adhesive to the outside is relatively small as compared with other portions, and a gap (recess) 60d is formed.

In addition, since the protruding portion 7321 of the latch 732 protrudes from the lower end of the side plate portion 53 of the cover 5, a recess (gap 60e), which is a portion where the amount of protrusion of the waterproof adhesive to the outside is relatively small, is formed between the lower surface of the latch 732 and the upper surface 421 of the peripheral wall 42 of the base 4.

In the present embodiment, on the surface of the side plate portion 53 of the cover 5 provided with the latch 732 of the snap-fit coupling portion 73, a bypass 8d for changing the direction in which the liquid droplets flow down is provided at a position located above the gaps (recesses) 60d and 60e.

The bypass 8d has, for example, at least one (three in the present embodiment) groove portion 8d1 provided in the side plate portion 53. The groove portion 8d1 is a fan-shaped groove recessed with respect to the side plate portion 53 or the rear plate portion 54, and includes a bottom surface 8d2, an upper inner wall 8d3, two side inner walls 8d4, and a lower inner wall 8d5.

The bottom surface 8d2 is, for example, substantially parallel to the side plate portion 53 or the rear plate portion 54, and the upper inner wall 8d3, the two side inner walls 8d4, and the lower inner wall 8d5 intersect, for example, substantially perpendicularly to the side plate portion 53 or the rear plate portion 54. The upper inner wall 8d3 and the lower inner wall 8d5 are, for example, higher on central portion and lower on both end portions. Therefore, the liquid droplets flowing down along the surface of the side plate portion 53 or the rear plate portion 54 above the snap-fit coupling portion 73 flow down to both end sides along the upper inner wall 8d3 and the lower inner wall 8d5, and the sealing material 6a flows down to a portion protruding from between the side plate portion 53 of the cover 5 and the peripheral wall 42 of the base 4.

Figures 18, 19:
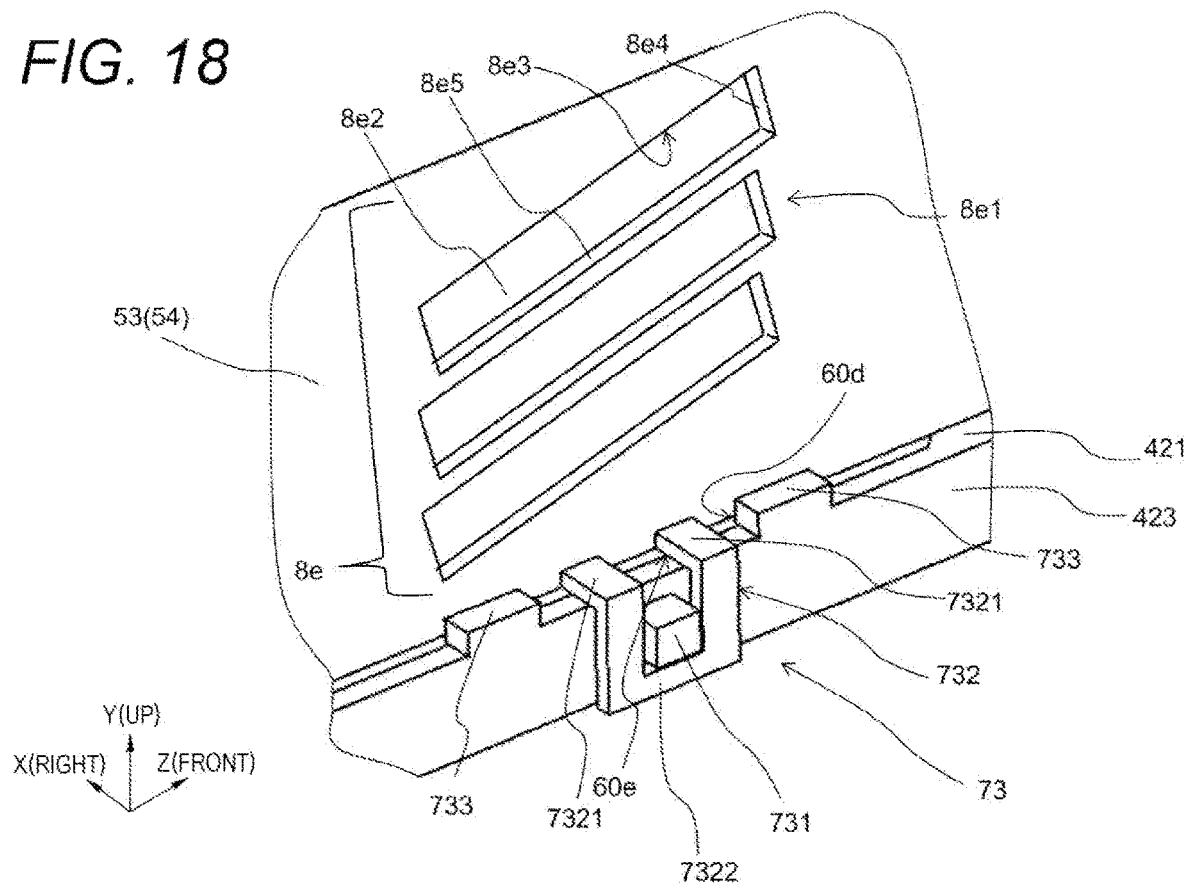
FIG. 18 is an enlarged perspective view of a snap-fit coupling portion and another bypass of the electronic control device according to the fourth embodiment of the present invention.
FIG. 19 is a perspective view of an electronic control device according to a fifth embodiment of the present invention.

FIG. 18 is an enlarged perspective view of a snap-fit coupling portion 73 and another bypass 8e of the electronic control device according to the present embodiment. Similarly to the bypass 8d, the other bypass 8e of the present embodiment has at least one (three in the present embodiment) groove portion 8e1 provided in the side plate portion 53. The groove portion 8e1 is a linear groove recessed with respect to the side plate portion 53 or the rear plate portion 54, and includes a bottom surface 8e2, an upper inner wall 8e3, two side inner walls 8e4, and a lower inner wall 8e5.

The bottom surface 8e2 is, for example, substantially parallel to the side plate portion 53 or the rear plate portion 54, and the upper inner wall 8e3, the two side inner walls 8e4, and the lower inner wall 8e5 intersect, for example, substantially perpendicularly to the side plate portion 53 or the rear plate portion 54. The upper inner wall 8e3 and the lower inner wall 8e5 are, for example, lower on the front side and higher on the rear side. Therefore, the liquid droplets flowing down along the surface of the side plate portion 53 or the rear plate portion 54 above the snap-fit coupling portion 73 flow to the front side along the upper inner wall 8e3 and the lower inner wall 8e5, and the sealing material 6a flows down to a portion protruding from between the side plate portion 53 of the cover 5 and the peripheral wall 42 of the base 4.

The upper inner wall 8e3 and the lower inner wall 8e5 may be higher on the front side and lower on the rear side, for example. In this case, the liquid droplets flowing down along the surface of the side plate portion 53 or the rear plate portion 54 above the snap-fit coupling portion 73 flow down along the upper inner wall 8e3 and the lower inner wall 8e5 to the rear side, and the sealing material 6a flows down to a portion protruding from between the side plate portion 53 of the cover 5 and the peripheral wall 42 of the base 4.

Further, the bypass 8d may have, for example, at least one linear projection provided on the side plate portion 53.

Operation and Effect

In the electronic control device 14 according to the present embodiment, the gaps (recesses) 60c and 60d, which are portions where the amount of protrusion of the waterproof adhesive to the outside is relatively small, may be formed in the portion where the snap-fit coupling portion 73 is provided. However, the bypass 8d or the bypass 8e that covers both of the gaps (recesses) 60c and 60d and allows water droplets to flow through a portion where the sealing material 6a protrudes is provided above the gaps (recesses) 60c and 60d. Therefore, liquid droplets flowing down along the surface of the side plate portion 53 of the cover 5 are prevented from flowing into the gaps 60c and 60d. As a result, the amount of salt accumulated in the gaps 60c and 60d can be reduced, so that deterioration of waterproof performance can be reduced.

Fifth Embodiment

FIG. 19 is a plan-side perspective view of an electronic control device 15 according to the fifth embodiment.

As described above, the plurality of (four in the present embodiment) flanges 44 (44a, 44b) are coupled to the lower surface 412 and protrude outward in the X-axis direction (left-right direction). The peripheral wall 42 above the flange 44 is curved in an arc shape so that the distance from the center of the bolt hole 441 (44a1 and 44b1) becomes a predetermined value, and a surface thereof is a curved surface 425 (425a, 425b) that is curved.

In the present embodiment, a bypass 8f is provided above the second flange 44b which is a protruding portion protruding from the base 4 and above the sealing material 6a on which the waterproof adhesive located above the second flange 44b is solidified.

Figure 20:
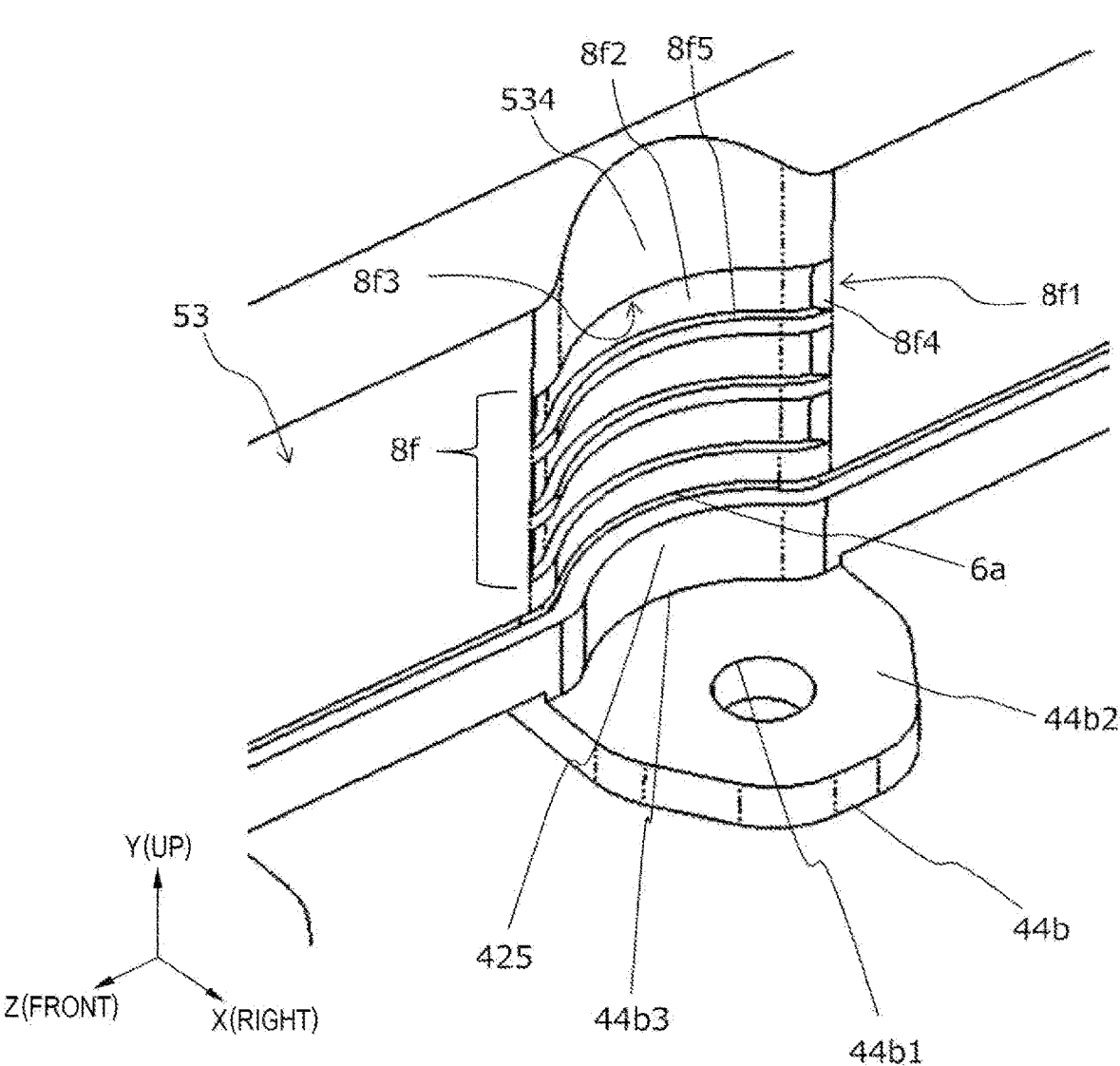
FIG. 20 is an enlarged perspective view of a bypass provided on a side surface plate portion of a cover in the electronic control device according to the fifth embodiment of the present invention.

FIG. 20 is an enlarged perspective view of the bypass 8f provided on the curved surface 534 of the side plate portion 53 of the cover 5 in the electronic control device 15 according to the present embodiment.

The bypass 8f is a flow path for suppressing liquid droplets from flowing down to the second flange 44b along the surface of the curved surface 534 of the side plate portion 53.

The bypass 8f forms at least one groove 8f1. The groove 8f1 is a linear groove recessed with respect to the curved surface 534, and includes a bottom surface 8f2, an upper inner wall 8f3 connected to the bottom surface 852 on the upper side, two side inner walls 8f4 connected to the bottom surface 852 at both ends in the front-rear direction, and a lower inner wall 8f5 connected to the bottom surface 852 on the lower side.

The bottom surface 8/2 is, for example, substantially parallel to the curved surface 534 of the cover 5, the upper inner wall 8/3 and the lower inner wall 8/5 intersect, for example, substantially perpendicular to the curved surface 534 of the cover 5, and the two side inner walls 8/4 intersect, for example, substantially perpendicular to the upper inner wall 8c3 and the lower inner wall 8c5.

Operation and Effect

Figure 21:
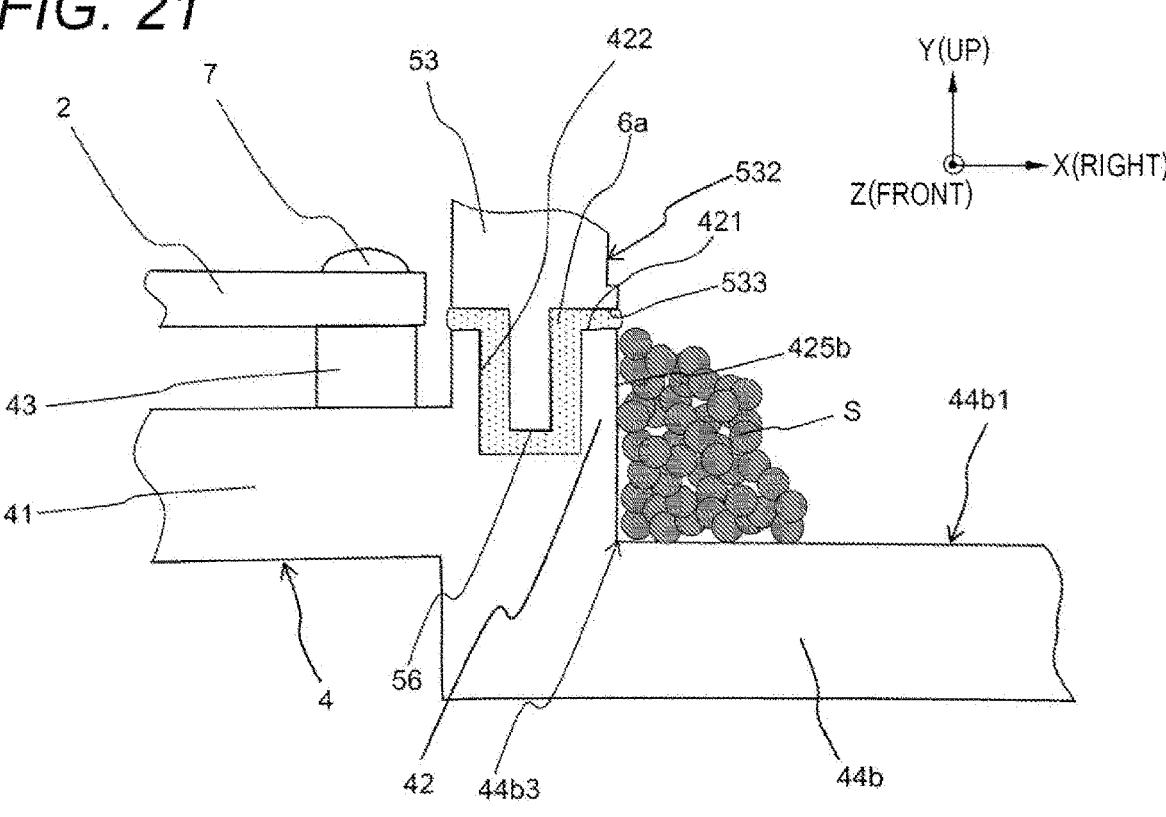
FIG. 21 is a schematic view illustrating a state in which a residual liquid droplet accumulates at an intersection portion between a flange and a peripheral wall in a cross-section taken along arrows D-D of the electronic control device illustrated in FIG. 1.

FIG. 21 is a schematic view illustrating a state in which a residual liquid droplet accumulates at an intersection portion between the flange and the peripheral wall in a cross-section taken along arrows D-D of the electronic control device illustrated in FIG. 1. As shown in this drawing, liquid droplets are likely to accumulate at an intersection 44b3 where the upper surface 44b2 of the second flange 44b and the curved surface 425b of the peripheral wall 42 intersect each other. When the electronic control device 1 is continuously used, the salt S in the liquid droplets accumulates and reaches the sealing material 6a, and there is a possibility that the seal boundary surface is corroded and the waterproof performance is lost regardless of the presence or absence of the gap 60 described in the first to fourth embodiments.

Therefore, in the electronic control device 15 according to the present embodiment, the bypass 8f is provided above the waterproof adhesive (sealing material 6a) located above the second flange 44b, which is the protrusion protruding from the base 4, and above the second flange 44b. The bypass 8f (lower inner wall 8c5) prevents the liquid droplets flowing down along the surface of the side plate portion 53 of the cover 5 from flowing down to the second flange 44b, so that the amount of salt accumulated on the second flange 44b can be reduced, and the deterioration of the waterproof performance of the electronic control device 15 can be reduced.

Figure 22:
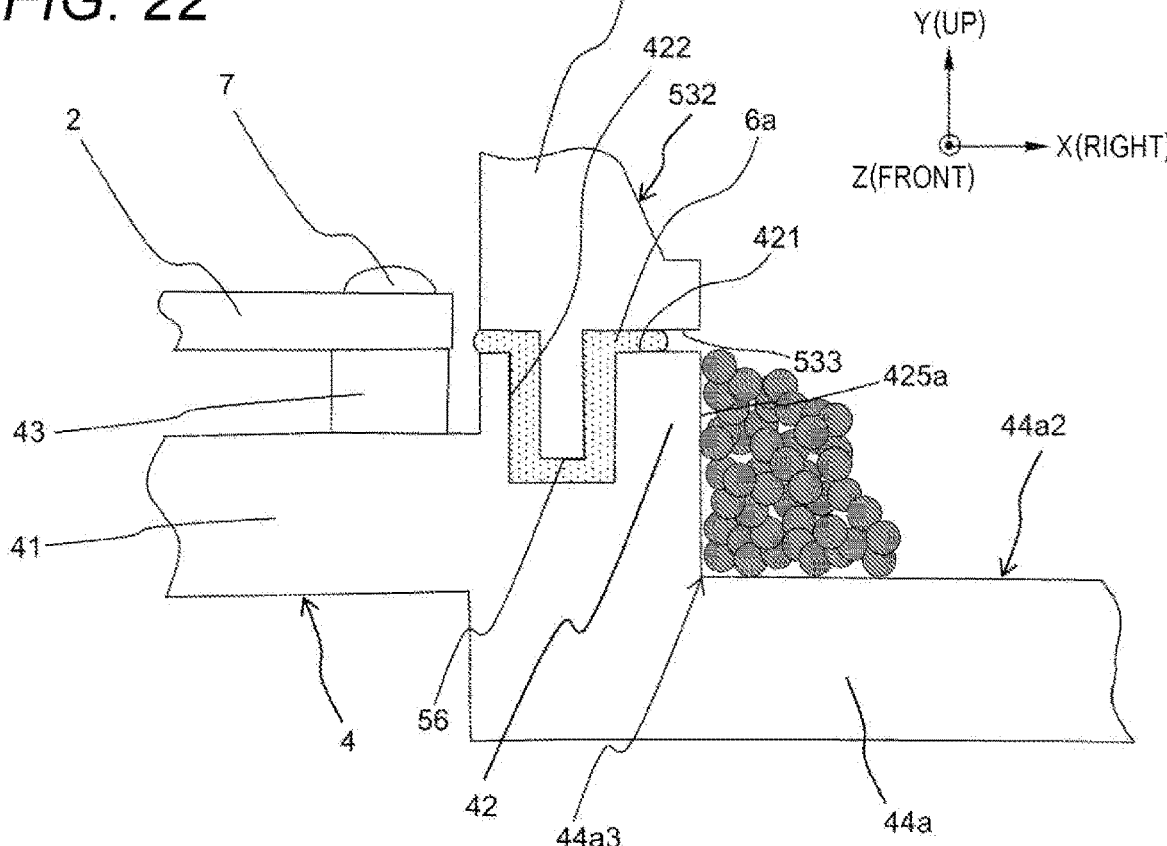
FIG. 22 is a schematic view illustrating a state in which a residual liquid droplet accumulates at an intersection portion between the flange and the peripheral wall in a cross-section taken along arrows C-C of the electronic control device illustrated in FIG. 1.

Incidentally, FIG. 22 is a schematic diagram illustrating a state in which a residual liquid droplet is accumulated in an intersection portion 44a3 between the upper surface 44a2 of the first flange 44a and the curved surface 425a of the peripheral wall 42 in a cross-section taken along arrows C-C of the electronic control device illustrated in FIG. 19.

As illustrated in this drawing, the liquid droplets are likely to accumulate at the intersection 44a3 where the upper surfaces 44a2 of the two first flanges 44a on the front side and the curved surface 425a of the peripheral wall 42 intersect, and the residue S accumulates and reaches the sealing material 6a, which may corrode the seal boundary surface and impair the waterproof performance.

Therefore, it is preferable to provide the second bypass 8b of the first embodiment above the first flange 44a. The second bypass 8b also has an effect of suppressing accumulation of liquid droplets (salt) on the upper surfaces 44a2 of the two first flanges 44a.

Note that the bypass 8f of the fifth embodiment may be provided in the cover 5 of the electronic control device 1 of the first embodiment.

Note that the present invention is not limited to the above-described embodiments, and includes various modifications. For example, the above-described embodiments have been described in detail for easy understanding of the present invention, and are not necessarily limited to those having all the described configurations. Further, a part of the configuration of one embodiment can be replaced with the configuration of another embodiment, and the configuration of another embodiment can be added to the configuration of one embodiment. In addition, it is possible to add, delete, and replace other configurations for a part of the configuration of each embodiment.

Embodiments of the present invention may have the following aspects. For example, the embodiment in which the bypass 8 is provided in the cover 5 and the connector 3 has been described. However, the present invention is not limited thereto, and may be provided on the base 4.

In addition, the liquid forming the liquid droplets is not limited to water containing salt, and is also effective for liquid containing a component that may corrode the seal boundary surface.

REFERENCE SIGNS LIST

1, 12, 13, 14, 15 electronic control device
2 circuit board
3 connector
4 base
42 peripheral wall
423 corner
425, 425a, 425b curved surface
44 flange (protruding portion)
44a first flange
44b second flange
443 intersection portion
5 cover
6, 6a, 6b sealing material
7 fastening portion
73 snap-fit coupling portion
731 hook
732 latch
733 guide
8, 8c, 8d, 8e, 8f bypass
8a first bypass
8a1, 8c1, 8f1 groove
8a6 stepped portion
8b second bypass
8b1, 8b2 protrusion
8b3 upper surface
8b4 side surface
8b5 lower surface
8d1, 8e1 groove portion
60, 60a, 60b
60c, 60d, 60e gap (recess)

The invention claimed is:
1. An electronic control device comprising:
a base member that holds a board;
a cover that covers the board;
a connector that electrically connects the board and an outside;
a waterproof adhesive applied between any two of the base member, the cover, and the connector; and
a liquid bypass provided above a recess that is a portion where an amount of protrusion of the waterproof adhesive to the outside is relatively small, or above a waterproof adhesive located above a protrusion of the waterproof adhesive protruding from the base member, wherein
the liquid bypass includes a stepped portion provided on a side surface of any one of the base member, the cover, and the connector and extending in a lateral direction,
an upper portion of the stepped portion is opened,
the bypass is at least one linear groove or projection provided in any one of the base member, the cover, and the connector, the at least one linear projection includes one linear projection, the one linear projection has a plurality of surfaces, and in the plurality of surfaces, an intersection angle between any two surfaces among the plurality of surfaces is a right angle or more.

2. The electronic control device according to claim 1, wherein the recess is formed between the base member and the cover or between the base member and the connector.

3. The electronic control device according to claim 2, wherein the recess is located between a corner of the base member and the cover.

4. The electronic control device according to claim 1, wherein the base member and the cover are coupled by snap-fit, and the recess is located in a portion constituting the snap-fit component.

5. The electronic control device according to claim 4, wherein the bypass has at least one groove, and the at least one groove is a fan-shaped groove having a high center and low ends or a linear groove having one high end and the other low end.

6. The electronic control device according to claim 1, wherein the protrusion is a flange protruding from the base member.

7. The electronic control device according to claim 6, wherein a portion intersecting the flange of a peripheral wall surrounding the periphery of the base member is curved.

8. The electronic control device according to claim 1, wherein the at least one linear groove or projection is inclined.

* * * * *